United States Patent
Yogo et al.

(10) Patent No.: US 6,537,884 B1
(45) Date of Patent: Mar. 25, 2003

(54) SEMICONDUCTOR DEVICE AND METHOD OF MANUFACTURING THE SAME INCLUDING AN OFFSET-GATE STRUCTURE

(75) Inventors: Yukiaki Yogo, Nukata-gun (JP); Shigemitsu Fukatsu, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/389,381

(22) Filed: Sep. 3, 1999

(30) Foreign Application Priority Data

Sep. 7, 1998 (JP) .............................. 10-268945

(51) Int. Cl.[7] .......................................... H01L 21/336
(52) U.S. Cl. ...................... 438/286; 438/301; 438/305; 438/306; 438/307
(58) Field of Search ...................... 257/327; 438/286, 438/301, 305, 306, 307

(56) References Cited

U.S. PATENT DOCUMENTS

| | | | |
|---|---|---|---|
| 3,787,962 A | | 1/1974 | Yoshida et al. |
| 4,908,326 A | * | 3/1990 | Ma et al. ..................... 257/327 |
| 5,216,272 A | * | 6/1993 | Kubokoya et al. .......... 257/327 |
| 5,328,864 A | | 7/1994 | Yoshizumi et al. |
| 5,547,885 A | * | 8/1996 | Ogoh |
| 5,607,866 A | | 3/1997 | Sato et al. |
| 5,759,897 A | * | 6/1998 | Kadosh et al. .............. 438/286 |
| 5,789,298 A | * | 8/1998 | Gardner et al. ............. 438/286 |
| 6,066,534 A | * | 5/2000 | Son ............................ 438/299 |
| 6,211,001 B1 | * | 4/2001 | Hsu ............................ 438/220 |

FOREIGN PATENT DOCUMENTS

| | | |
|---|---|---|
| JP | 61-43464 | 3/1986 |
| JP | 61-148839 | 7/1986 |
| JP | 2-271673 | 11/1990 |
| JP | 2-271674 | 11/1990 |
| JP | 4-196442 | 7/1992 |
| JP | 5-259115 | 10/1993 |

* cited by examiner

*Primary Examiner*—John F. Niebling
*Assistant Examiner*—Ron Pompey
(74) *Attorney, Agent, or Firm*—Harness, Dickey & Pierce, PLC

(57) ABSTRACT

A semiconductor device having an offset-gate structure, which can achieve a release of an electric field concentration and a lowering a transistor resistance at the same time. A semiconductor device has the offset-gate structure in which an offset region, at which a gate portion is not formed, is formed between an end of the gate portion and a drain on a silicon substrate. Surfaces of a source, the drain and a gate electrode of the gate portion are silicides to reduce a transistor resistance. Whereas a surface of the offset region formed between the gate portion and the drain does not include silicide. to prevent a potential of an end portion of the gate portion from being identical to a potential of the drain due to silicide. Therefore, it can achieve a release of an electric field concentration and a lowering a transistor resistance at the same time.

10 Claims, 17 Drawing Sheets

SEMICONDUCTOR DEVICE AND METHOD OF MANUFACTURING THE SAME INCLUDING AN OFFSET-GATE STRUCTURE

CROSS REFERENCE TO RELATED APPLICATION

This application is based upon Japanese Patent Application No. Hei. 10-268945 filed on Sep. 7, 1998, the contents of which are incorporated herein by reference.

BACKGROUND OF THE INVENTION

1. Field of the Invention

This invention relates to a semiconductor device and especially to a semiconductor device having a MOS (Metal Oxide Semiconductor) type transistor, and method of manufacturing the same.

2. Related Art

A MOS type transistor having an offset-gate structure has been proposed. This MOS type transistor can release an electric field concentration at an end position of a gate to enhance a drain withstand voltage by providing an offset region, which is a non-gate-forming portion, between the end position of the gate and a drain on a surface of a silicon substrate.

The offset-gate structure is formed by adopting photolithography so as to prevent the offset region from being implanted impurities as donor or acceptor, when a source and the drain are formed after forming a gate portion on the surface of the silicon substrate.

On the contrary, in order to comply with a desire for high-speed operation of a transistor, there has been known a Salicide (Self Aligned Silicide) technology that a gate, a source and a drain are changed to suicides to reduce a transistor resistance. The Salicide technology generally has the following steps. That is, after forming the gate portion, the source and the drain, a metal such as titanium (Ti) is deposited, and then surfaces of a gate electrode, the source and the drain are changed to silicides with a self-alignment.

However, when the Salicide technology is adopted to the transistor having the offset structure, part of the offset region on the surface of the silicon substrate is also changed to silicide, and accordingly, the surface of the silicon substrate is electrically conducted from the drain to the end portion of the gate via the silicide. As a result, an electric field concentration occurs at the end portion of the gate on the silicon substrate. Therefore, it is difficult to achieve a release of the electric field concentration and a lowering the transistor resistance at the same time.

SUMMARY OF THE INVENTION

This invention has been conceived in view of the background thus far described and it is an object to provide a semiconductor device, which can achieve a release of an electric field concentration and a lowering a transistor resistance at the same time.

According to the present invention, since surfaces of a source, a drain and a gate electrode are silicides, a transistor resistance is reduced. Furthermore, since a surface of an offset region formed between the gate portion and the drain does not include silicide, it can prevent a potential of an end portion of the gate portion from being identical to a potential of the drain due to silicide, and it can achieve a release of an electric field concentration and a lowering a transistor resistance at the same time.

According to another aspect of the present invention, a spacer covering an offset region is formed by spacer forming step. At metal deposition step, a deposited metal formed at the offset region does not contact with a silicon surface of a silicon substrate because of an existence of the spacer. Therefore, at the silicide step, surfaces of a source, a drain and a gate electrode are changed to suicides with a self-alignment, whereas and a surface of the offset region is not changed to silicide. Hence, it can manufacture a semiconductor device, which can achieve a release of an electric field concentration and a lowering a transistor resistance at the same time.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

First Embodiment

Figure 1:
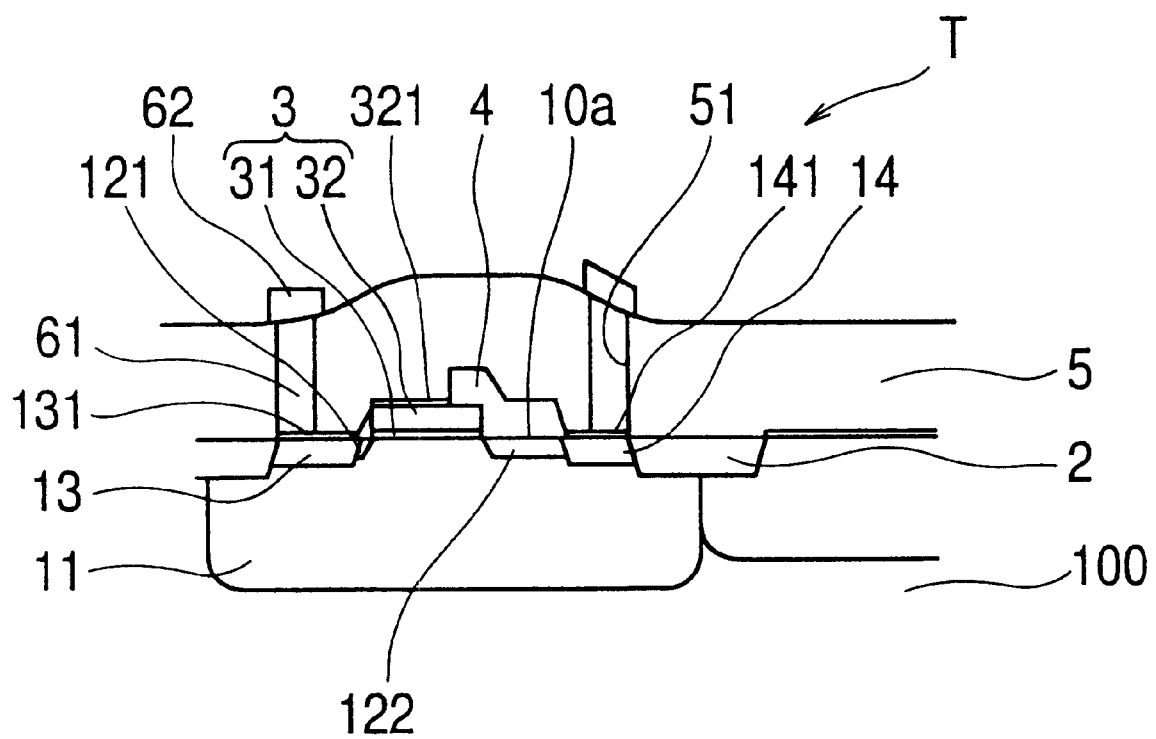
FIG. 1 is a schematic sectional view of a semiconductor device of a First Embodiment according to the present invention.

FIG. 1 shows a sectional view of a semiconductor device according to the present invention. The semiconductor device includes a MOS type transistor T, which has a silicon substrate 100, a well 11 formed in the silicon substrate 100 and an element isolation oxide film 2 forming a transistor region. A source 13 and a drain 14 are formed at the transistor region. Electric field releasing layers 121, 122 having a low impurity concentration with respect to the source 13 and the drain 14 are formed at each of one ends of the source 13 and the drain 14 to form a LDD (Lightly Doped Drain) structure.

On a surface of the silicon substrate 100, the source 13 and the drain 14 are formed in stripe-shapes toward the normal direction of this figure. A gate portion 3 is formed by laminating a gate oxide film 31 and a gate electrode 32 made of polysilicon, and controls an electric current flowing in a channel defined between the source 13 and the drain 14.

The gate portion 3 is arranged to offset to the source 13 side. A left end of the gate portion 3 is substantially positioned at a tip of the source 13, and a right end of the gate portion 3 is positioned to have a short distance from the drain 14. At the surface of the silicon substrate 10, an offset region 10a as a non-gate-forming portion is defined between around a right end of the gate potion 13 and the drain 14 to form a so-called offset-gate structure. The electric field releasing layer 122 of the drain 14 side is formed at the offset region 10a.

A spacer 4 made of insulating material is formed at a sidewall of the gate portion 3. The spacer 4 is formed to cover the offset region 10a, and contacts with a silicon (Si) surface of the offset region 10a.

The gate electrode 32, the source 13 and the drain 14 are changed to silicides, and their surfaces are changed to silicides 321, 131, 141 of metal such as titanium (Ti). The offset region does not have any silicides (a non-silicide-forming region).

An interlayer film 5 is formed to cover the silicon substrate 100 having the element isolation oxide film 2 and the gate portion and so on. The source 13 and the drain 14 are electrically connected to an aluminum (Al) wire pattern 62 through a plug wire 61. Furthermore, the gate electrode 32 is also electrically connected to the not-shown Al wire pattern.

Operations of the semiconductor device will be explained hereinafter. A driving voltage is applied between the source 13 and the drain 14, and a control voltage is applied to the gate electrode 32. A channel is generated between the source 13 and the drain 14 in the silicon substrate 100 by applying the control voltage to the gate electrode 32. Since the surfaces of the gate electrode 32, the source 13 and the drain 14 are changed to silicides, a transistor resistance is lowered. Since the offset region 10a is not changed to silicide, it can prevent a potential of the right end of the gate portion 3 from being identical to that of the drain 14 through the silicide on the surface of the silicon substrate 100. Accordingly, it can effectively prevent the electric field concentration at the end portion of the gate portion 3 inherent in the offset-gate structure transistor, and can improve the drain withstand voltage.

Next, a method of manufacturing the semiconductor device will be explained hereinafter. FIGS. 2A through 2K are sectional views of a silicon wafer of each step in a wafer process of the semiconductor device. Here, the steps are explained on the assumption that the transistor is an n-type MOS.

Figure 2A:
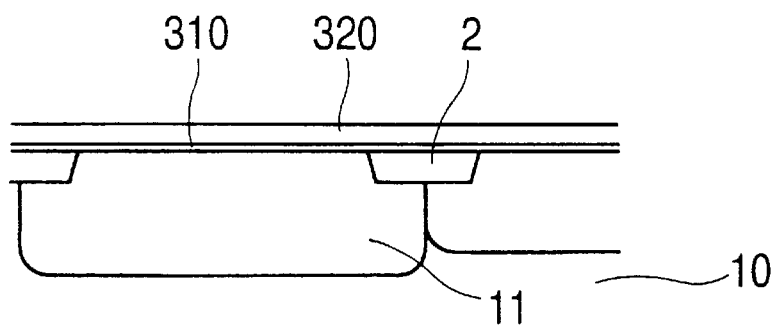
FIGS. 2A through 2K are schematic sectional views illustrating each step of a method of manufacturing the semiconductor device of the First Embodiment.

At a step shown in FIG. 2A, an oxide film 2 for element isolation is formed on a surface of (100) face of a p-type silicon wafer 10, which is to be the silicon substrate 100. A protection oxide film is formed on the surface with a thickness of 350 Å. Next, a p-type well (P-well) 11 is formed in the silicon wafer 10 by implanting impurities and annealing the silicon wafer 10 with a condition of 1150° C., approximately 30 minutes in nitrogen atmosphere. In the annealing step (thermal treatment), an oxide film is formed on the surface of the silicon wafer 10. This oxide film is removed by a wet etching using hydrofluoric acid (HF) to dispose the surface of the silicon again.

Next, a gate portion is formed by the following steps. An oxide film 310 having a thickness of a range of 90 to 120 Å, which is to be a gate oxide film 31 (see FIG. 1), is formed on the surface of the silicon wafer 10 by a thermal oxidation. Boron ions are implanted to the surface of the silicon wafer through the oxide film 310 with an implanting energy of a range of approximately 20 to 80 keV in order to adjust a threshold voltage of the transistor. After that, a polysilicon film 320, which is to be the gate electrode 32 (see FIG. 1) and has a thickness of approximately 3000 Å and an impurity concentration of a range of $1 \times 10^{20}$ cm$^{-3}$ to $5 \times 10^{20}$ cm$^{-3}$, is formed.

Figure 2B:
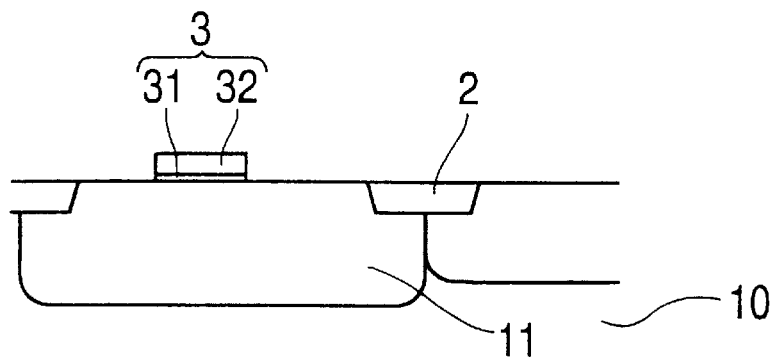
Figure 2C:
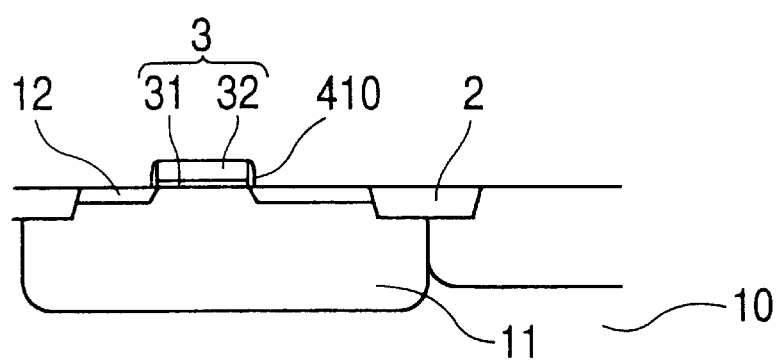
Figure 2D:
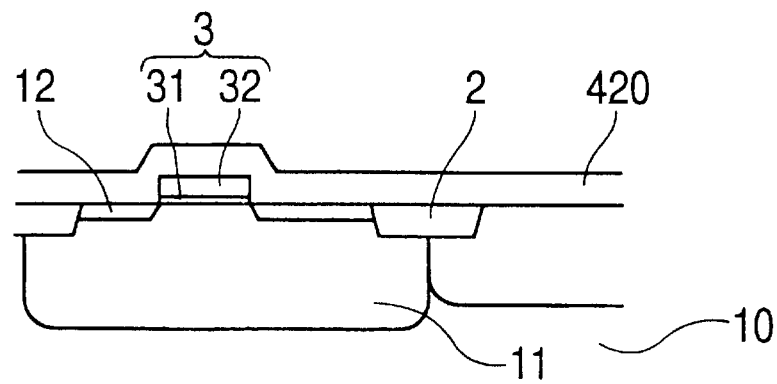

At a step shown in FIG. 2B, a photoresist pattern of the gate portion 3 is formed by using a photolithography at a designed portion where the gate portion 3 (see FIG. 1) is to be formed. One part of the polysilicon 320 positioned at a region where the photoresist pattern is not formed and one part of the oxide film 310 positioned under the one part of the polysilicon 320 are removed by a dry etching using chlorine-based gas and wet etching using dilute HF to form the gate portion 3 having a laminating structure of the gate oxide film 31 and the gate electrode 32.

A first spacer is formed by the following steps after removing the photoresist. At a step shown in FIG. 2C, an oxide film 410 having a thickness of approximately 150 Å is formed on the whole surface of the gate electrode 32 by a thermal oxidation with a condition of a range of 850 to 900° C. in oxygen atmosphere. In this way, a spacer, which rises from the surface of the silicon wafer, is formed at least on a sidewall of the gate portion 3. Here, the oxide film 410 is shown only on the sidewall of the gate portion 3, however, the oxide film 410 is actually formed on the whole surface of the silicon wafer in this embodiment.

A low impurity concentration region is formed by the following steps. Phosphorus (P) ions are implanted to the surface of the silicon wafer 10 with a condition of an implanting energy of 70 keV, and dose amount of $1.0 \times 10^{14}$ cm$^{-2}$ to form a impurity region 12 having a low impurity concentration in order to form electric field releasing layers 121, 122 (see FIG. 1).

A second spacer is formed by the following steps. At a step shown in FIG. 2D, oxide film {TEOS (tetraethylorthosilicate)} 420 having a thickness of 1500 Å is deposited on the oxide film 410, which is formed on the whole surface of the silicon wafer 10, by CVD (chemical vapor deposition).

Figure 2E:
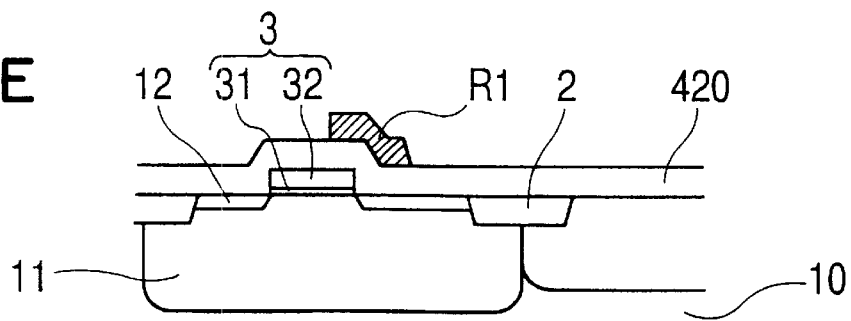

Next, at step shown in FIG. 2E, a photoresist pattern R1 is formed between the gate portion 3 and the drain 14 (see FIG. 1) by the photolithography so that the left end of the photoresist pattern R1 is slightly superposed with the gate portion 3.

Figure 2F:
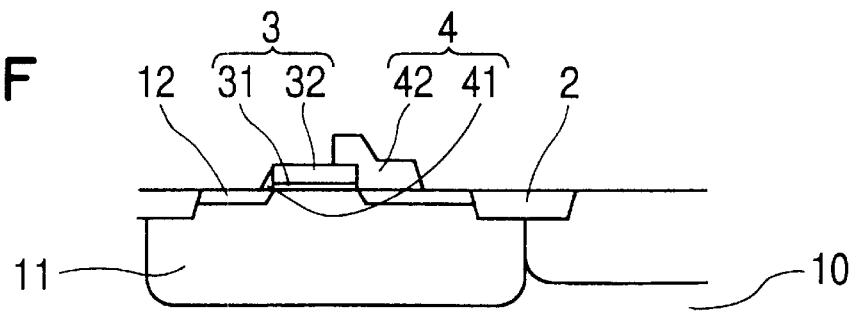
Figure 2G:
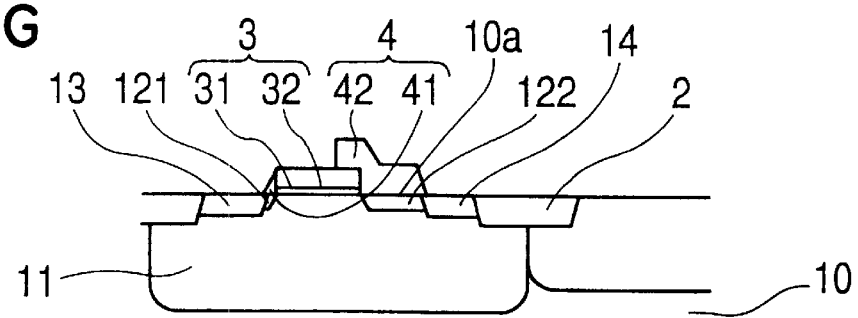
Figure 2H:
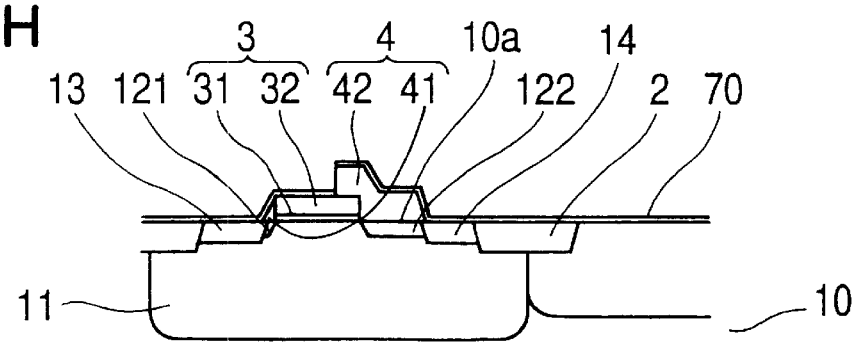
Figure 2I:
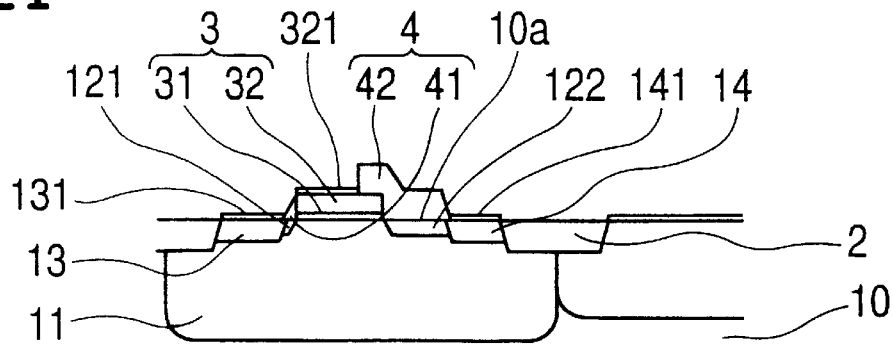

At a step shown in FIG. 2F, one part of the oxide film 410 and one part of the TEOS 420, both of which position at a region where the photoresist pattern R1 is not formed, are removed by an etching using chlorine-based gas such as $CF_4$ so that the oxide film 410 and the TEOS 420 are partially remained only on a sidewall of the gate portion 3 as an insulating film with a self-alignment. Next, the photoresist R1 is removed. As a result, the surface of the silicon wafer 10 at the offset region 10a, at which the gate portion 3 is not formed, is selectively covered by the oxide film 410 and the TEOS 420. The patterned oxide film 410 and the patterned TEOS 420, which are covered with the photoresist pattern R1, become a second insulating film 42 constituting a spacer 4. On the contrary, the not-patterned oxide film 410 and the not-patterned TEOS 420, which are not covered with the photoresist pattern R1, become the first insulating film 41 constituting the spacer 4.

A source and a drain are formed by the following steps. At a step shown in FIG. 2G, the source 13 and the drain 14 are formed by implanting arsenic (As) ions with a condition of, for example, 40 keV, $5.0 \times 10^{15}$ cm$^{-2}$. In this step, the source 13 and the drain 14 are formed with a self-alignment, because the gate portion 3 and the spacer 4 perform as a mask to prevent the As ions from reaching the silicon wafer 10.

Next, the source 13 and the drain 14 are activated by annealing of approximately 850° C., 20 minutes. An oxide film formed on the surface of the silicon substrate 10 in the activating step is removed. Here, the silicon is exposed at the surfaces of the gate electrode 32, the source 13 and the drain 14, except of small region at which the tip of spacer 4 is superposed, and only the offset region 10a is covered with a spacer 4.

Metal is formed by the following steps. At a step shown in FIG. 2H, a Ti/TiN film, which includes a Ti (titanium) film having a thickness of approximately 350 Å and a TiN (titanium nitride) film having a thickness of 800 Å, is deposited on the whole surface of the silicon wafer 10. Then the Ti/TiN film 70 is changed to silicide by performing an annealing of a range of 600 to 650° C., 30 seconds. On the surfaces of the gate electrode 32, the source 13 and the drain 14, at which the Si is exposed, the deposited Ti/TiN film 70 is alloyed (to be silicide) with Si during the annealing. On the contrary, at the offset region 10a, the deposited Ti film 70 is not reacted with Si because of a presence of the spacer 4.

The metal is etched by the following steps. At a step shown in FIG. 2I, the Ti/TiN film 70 on the spacer 4, which is not alloyed with Si, is removed by a whole surface etching.

Furthermore, an annealing of a range of 800 to 850° C., 30 seconds is performed to completely alloy the Ti remained on the gate electrode 32, the source 13 and the drain 14.

Figure 2J:
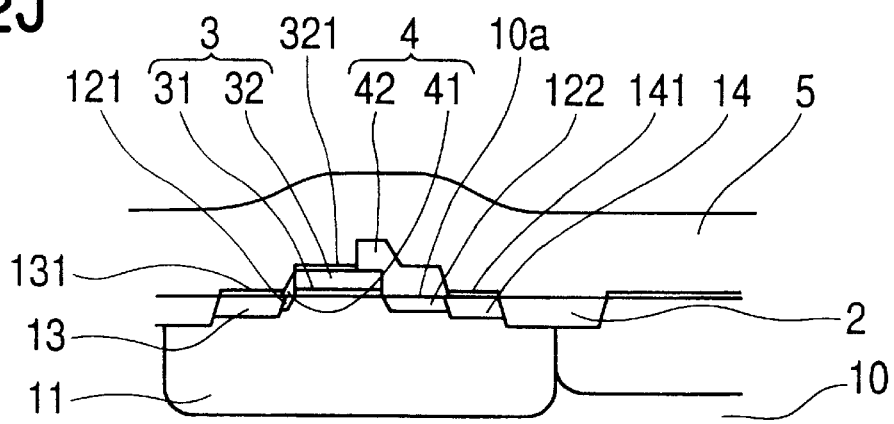

At a step shown in FIG. 2J, after forming a basic structure of the transistor, an interlayer film 5 is formed on the silicon wafer 10 having the gate portion 3 and spacer 4 by depositing a glass which is doped by boron (B) and phosphorus (P) {BPSG (boron-doped phospho-silicate glass)} having a thickness of approximately 5000 Å by using LPCVD (low-pressure CVD). After that, a step in the interlayer film 5 is flattened by annealing the silicon wafer 10 with a range of approximately 800 to 850° C. in nitrogen atmosphere.

Figure 2K:
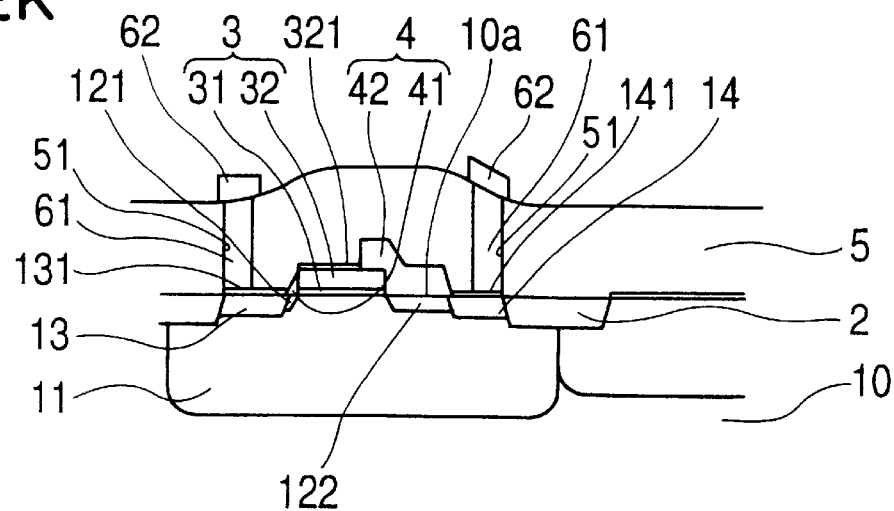

At a step shown in FIG. 2K, a hole pattern is formed on the interlayer layer 5 at the region where the gate portion 3, the source 13, and the drain 14 are to be formed. Then, contact holes 51, which penetrate the interlayer film 5 and reach the silicide gate electrode 32, the silicide source 13 and the silicide drain 14, are formed by dry etching.

Next, a Ti film having a thickness of approximately 700 Å and a TiN film having a thickness of approximately 2000 Å are deposited on the silicon wafer 10 by the CVD, and a tungsten (W) layer is deposited by the LPCVD in order to bury the contact holes 51 to form W-plug wires 61. The W-plug wires 61 are electrically connected the gate electrode 32, the source 13 and the drain 14 with the other portions.

Then, parts of the W, Ti, TiN other than those buried in the contact holes 61 are removed by the whole surface etching.

After forming a film by depositing Al as well as a small amount of Si, copper (Cu), a photoresist pattern of Al wire pattern 62 (see FIG. 1) is formed by the photolithography. The Al wire pattern 62 is formed by etching the deposited film by using the photoresist pattern as a mask. After that, the photoresist pattern is removed. In these ways, the semiconductor device of this embodiment is completed.

According to the method of manufacture of this embodiment, it can achieve a release of an electric field concentration and a lowering a transistor resistance at the same time, when the present invention is adopted to the semiconductor device having the LDD structure.

Second Embodiment

FIGS. 3A through 3L are sectional views of a silicon wafer of each step in a wafer process of the semiconductor device. Here, the steps are explained on the assumption that the semiconductor device of the present invention is adapted to a semiconductor device having a CMOS (Complementary MOS) structure. In these figures, a left side of the silicon wafer 10 is an n-type MOS transistor region (n-channel transistor region) 1A as a first kind transistor region, and a right side of the silicon wafer 10 is a p-type MOS transistor region (p-channel transistor region) 2A as a second kind transistor region. In the drawings, same portions or corresponding portions are put the same numerals each other because they are formed by substantially the same steps and perform substantially the same effect. The difference between the First Embodiment will be mainly explained.

Figure 3A:
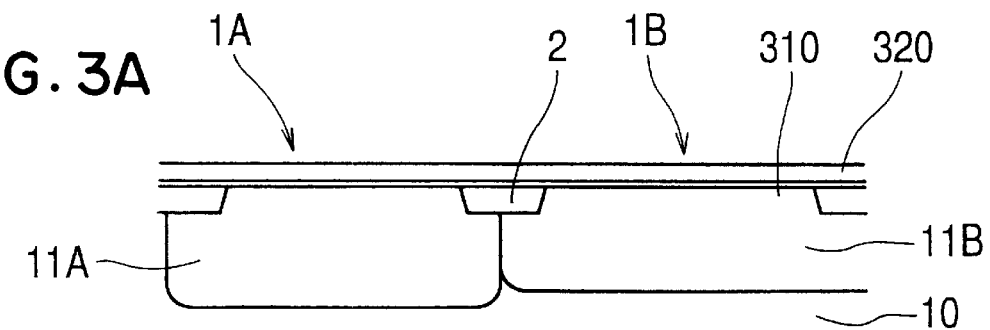
FIGS. 3A through 3L are schematic sectional views illustrating each step of a method of manufacturing the semiconductor device of a Second Embodiment.
Figure 3B:
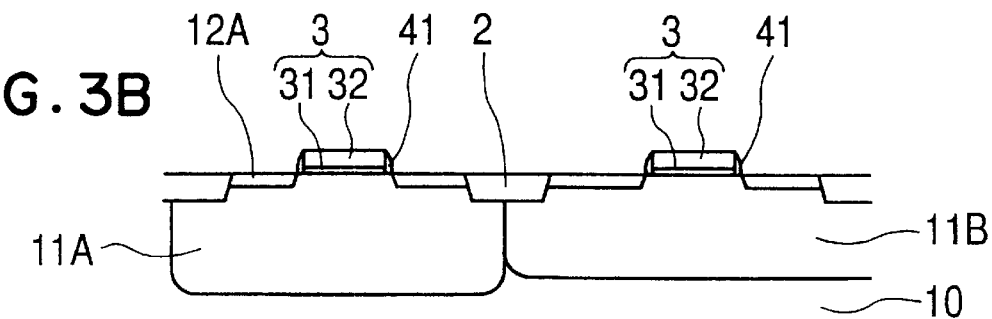

At a step shown in FIG. 3A, an element isolation oxide film 2 is formed on the surface of the silicon wafer 10, and a protection oxide film having a thickness of approximately 350 Å is formed on the surface of the silicon wafer 10. A p-type well (P-well) 11A and an n-type well (N-well) 11B are formed in the p-type silicon wafer 10 by implanting impurities and annealing the silicon wafer 10 with a condition of 1150° C., approximately 30 minutes in nitrogen atmosphere. An oxide film formed in the annealing step is removed by a wet etching using hydrofluoric acid (HF). Then, an oxide film 310 and polysilicon film 320 are formed.

A gate oxide film 31 and a gate electrode 32 are formed (gate portion forming step). At a step shown in FIG. 3B, a first insulating film 41 is formed on the sidewall of the gate portion 3 (first spacer forming step). Phosphorus (P) ions are implanted to the surface of the silicon wafer 10 with a condition of an implanting energy of approximately 70 kev, and a dose amount of approximately $1.0 \times 10^{14}$ cm$^{-2}$.

Figure 3C:
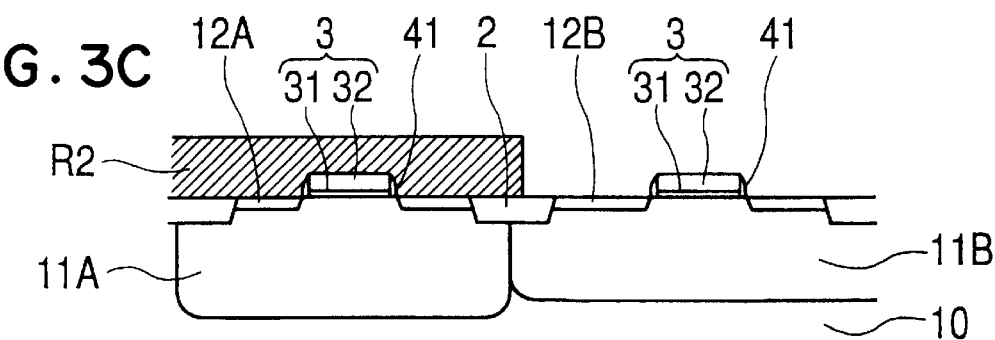
Figure 3D:
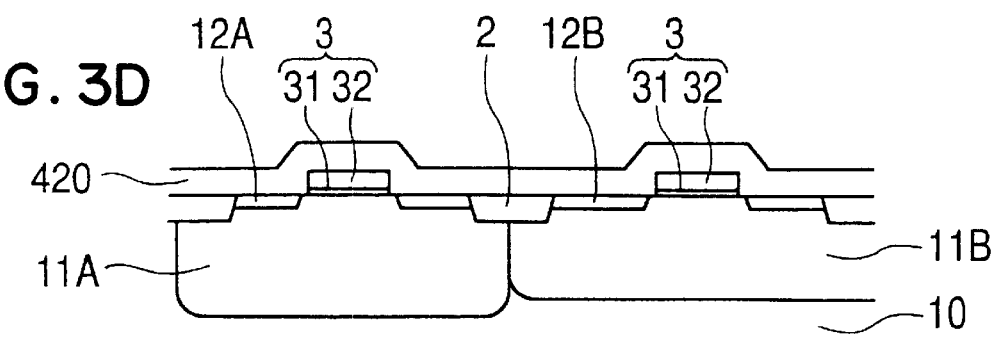

At a step shown in FIG. 3C, a photoresist pattern R2 is formed on the n-channel transistor region 1A by the photolithography. Boron (B) ions are implanted to the surface of the silicon wafer 10 with 50 keV and $5.0 \times 10^{13}$ cm$^{-2}$, and with 30 keV and $4.0 \times 10^{13}$ cm$^{-2}$. An n-type low impurity concentration region 12A is formed at the both sides of the gate portion 3 of the n-channel transistor region 1A in the silicon wafer 10 due to a mask operation of the photoresist pattern R2 and the gate portion 3, and also a p-type low impurity concentration region 12B is formed at the both sides of the gate portion 3 of the p-channel transistor region 1B.

Next, a second spacer is formed by the following steps. At a step shown in FIG. 3D, after removing the photoresist R2, a TEOS 420 having a thickness of 1500 Å is deposited by the CVD.

Figure 3E:
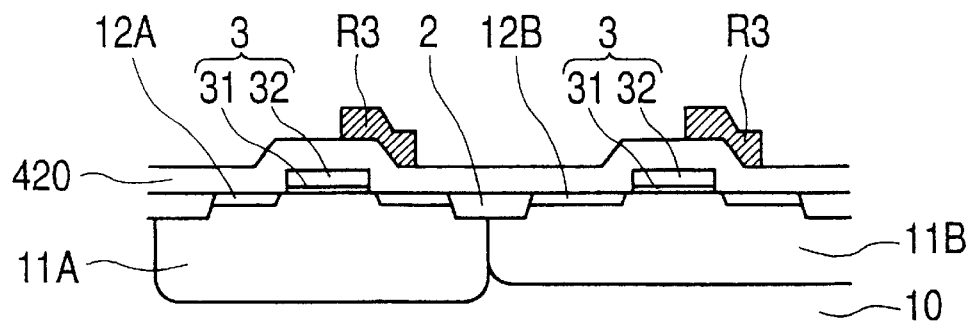

At a step shown in FIG. 3E, a photoresist pattern R3 is formed between the gate portion 3 and the drain 14 (see FIG. 1) by the photolithography so that a left end of the photoresist pattern R3 is slightly superposed with the gate portion 3.

Figure 3F:
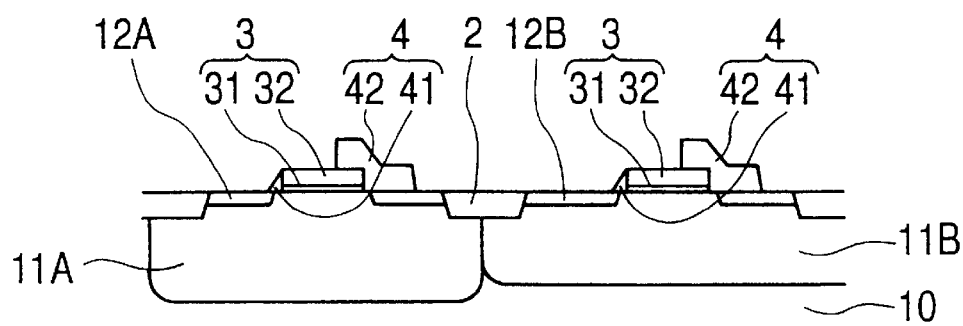
Figure 3G:
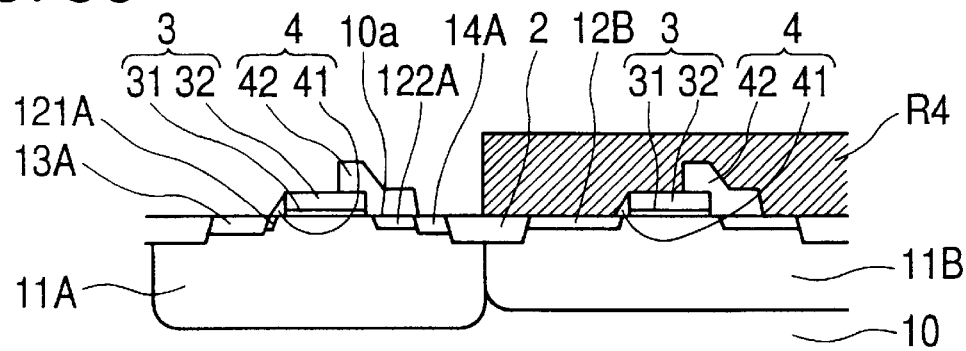

At a step shown in FIG. 3F, one part of the oxide film 410 and one port of the TEOS 420, each of which positions at a region where the photoresist pattern R3 is not formed, are removed by an etching using chlorine-based gas such as CF$_4$ so that the oxide film 410 and the TEOS 420 are partially remained only on a sidewall of the gate portion 3 as an insulating film with a self-alignment. In this way, a second insulating film 42 constituting the spacer 4 is formed. Next, the photoresist R3 is removed.

A source and a drain are formed by the following steps. At a step shown in FIG. 3G, a photoresist pattern R4 is formed at the p-channel transistor region 1B by the photolithography. Arsenic (As) ions are implanted only to the P-well 11A, at which the photoresist pattern R4 is not formed, with a condition of, for example, 40 keV, $5.0 \times 10^{15}$ cm$^{-2}$ to form a source 13A and a drain 14A in the n-channel transistor region 1A.

Figure 3H:
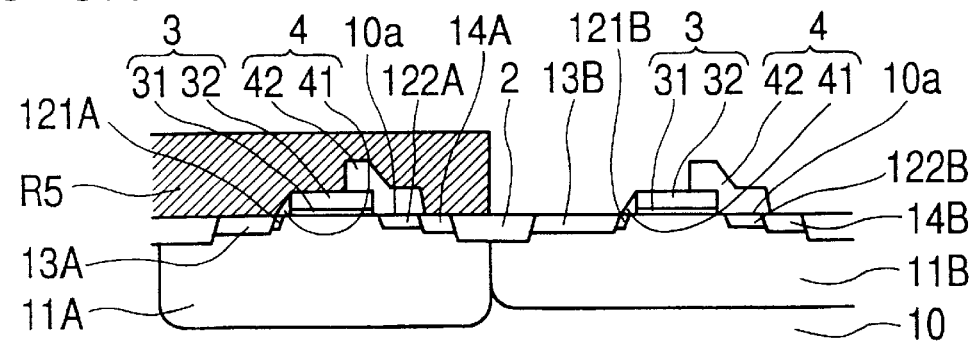

At a step shown in FIG. 3H, after removing the photoresist R4, a photoresist pattern R5 is formed at the n-channel transistor region 1A by the photolithography. Boron fluoride (BF$_2$) ions are implanted only to the N-well 11B, at which the photoresist pattern R5 is not formed, with a condition of, for example, 110 keV, $5.0 \times 10^{13}$ cm$^{-2}$ to form a source 13B and a drain 14B in the p-channel transistor region 1B. In these steps, the sources 13A, 13B and the drains 14A, 14B are formed with a self-alignment, because the gate portion 3 and the spacer 4 perform as masks to prevent the impurity (As, BF$_2$) ions from reaching the silicon wafer 10.

Next, the sources 13A, 13B and the drains 14A, 14B are activated by annealing of approximately 850° C., 20 minutes. An oxide film formed on the surface of the silicon substrate 10 in the activating step is removed.

Figure 3I:
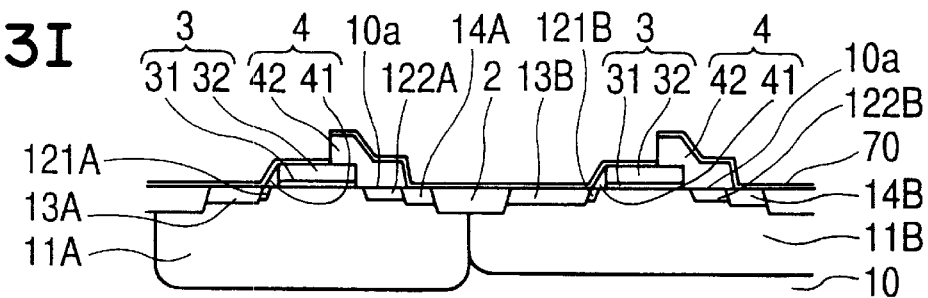

At a step shown in FIG. 3I, metal is formed by the following steps. A Ti/TiN film, which includes a Ti (titanium) film having a thickness of approximately 350 Å and a TiN (titanium nitride) film having a thickness of 800 Å, is deposited on the whole surface of the silicon wafer 10 (Metal deposition step). Then, silicide Ti is formed on the surfaces of the gate portion 3, the source 13 and the drain 14 by annealing of a range of 600 to 650° C., 30 seconds (Silicide step).

Figure 3J:
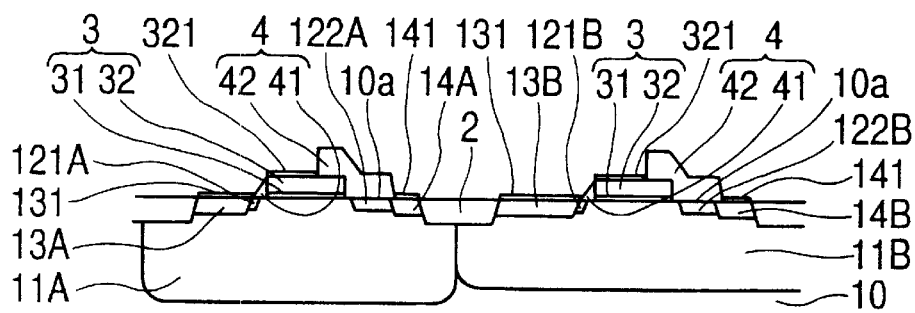

At a step shown in FIG. 3J, the metal is etched by the following steps. The Ti/TiN film 70 on the spacer 4 of the both transistor regions 1A, 1B is removed by a whole surface etching (Metal etching step).

An annealing of a range of 800 to 850° C., 30 seconds is performed to completely alloy the Ti remained on the gate portion 3, the sources 13A, 13B and the drains 14A, 14B.

Figure 3K:
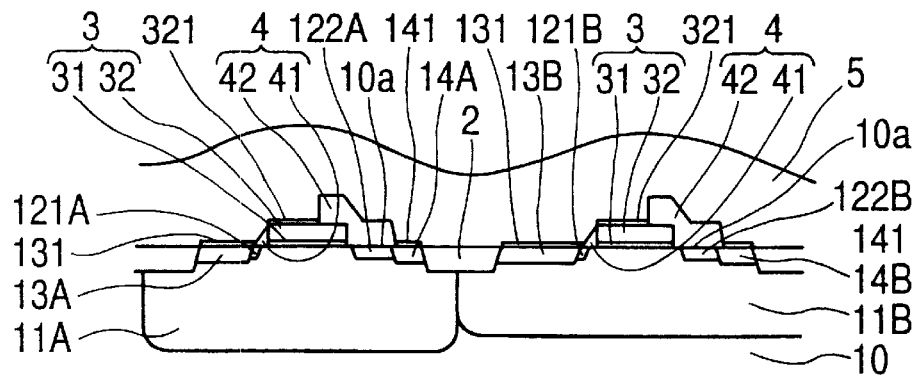

At a step shown in FIG. 3K, after forming a basic structure of the transistor, an interlayer film 5 is formed to cover the silicon wafer 10 having the gate portion 3 and the spacer 4.

Figure 3L:
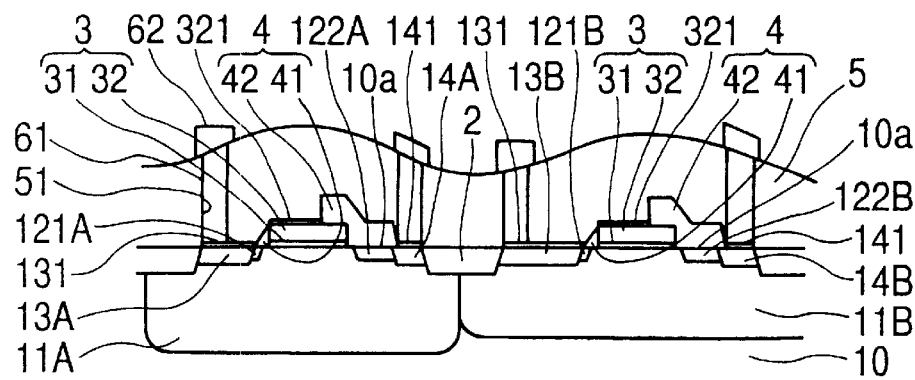

At a step shown in FIG. 3L, contact holes 51 are formed in the interlayer film 5 at the region where the gate portion 3, the sources 13A, 13B and the drains 14A, 14B are to be formed. After that, W-plug wires 61 are formed, and then Al wire pattern 62 is formed. In these ways, the semiconductor device of this embodiment is completed.

According to the method of manufacture of this embodiment, it can achieve a release of an electric field concentration and a lowering a transistor resistance at the same time, when the present invention is adopted to the semiconductor device having the CMOS structure.

Third Embodiment

FIGS. 4A through 4J are sectional views of a silicon wafer of each step in a wafer process of the semiconductor device. Here, the steps are explained on the assumption that the semiconductor device of the present invention is adapted to a semiconductor device having a hybrid structure of an offset-gate structure and the other structure. In these figures, a left side of the silicon wafer 10 is a transistor region 1 having the offset-gate structure, and a right side of the silicon wafer 10 is a transistor region 1C not having the offset-gate structure.

In the drawings, same portions or corresponding portions are put the same numerals each other because they are formed by substantially the same steps and perform substantially the same effect. The difference between the First Embodiment will be mainly explained. Here, the steps are explained on the assumption that the transistor is an n-type MOS.

Figure 4A:
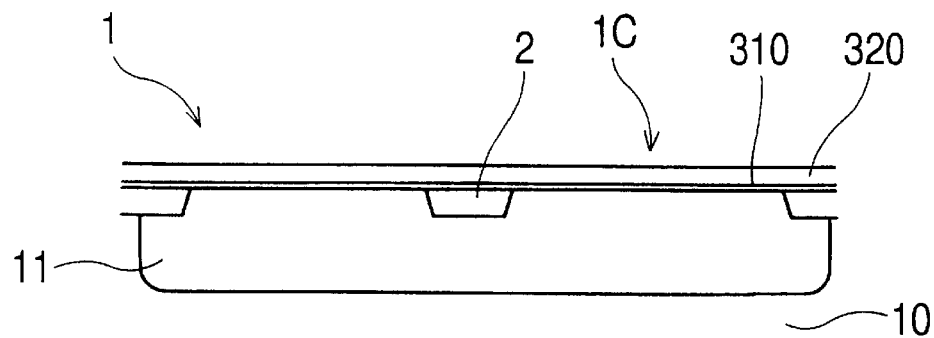
FIGS. 4A through 4J are schematic sectional views illustrating each step of a method of manufacturing the semiconductor device of a Third Embodiment.

At a step shown in FIG. 4A, an element isolation oxide film 2 is formed on the surface of the silicon wafer 10, and a protection oxide film having a thickness of approximately 350 Å is formed on the surface of the silicon wafer 10. A p-well 11 is formed in the silicon wafer 10 by implanting impurities and annealing the silicon wafer 10. The oxide film formed in the annealing step is removed by a wet etching using hydrofluoric acid (HF). Then, an oxide film 310 and polysilicon film 320 are formed.

Figure 4B:
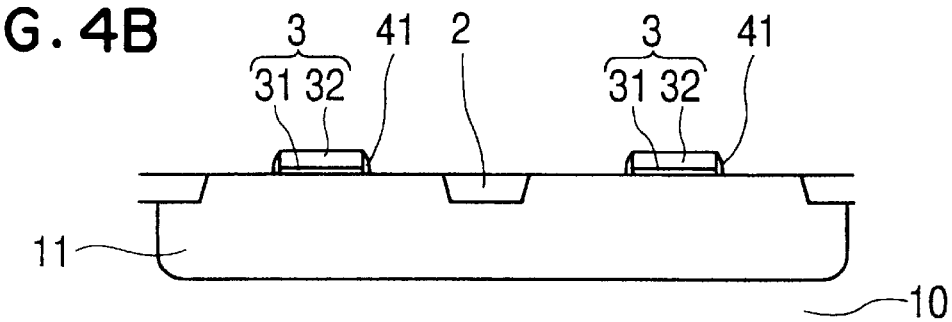
Figure 4C:
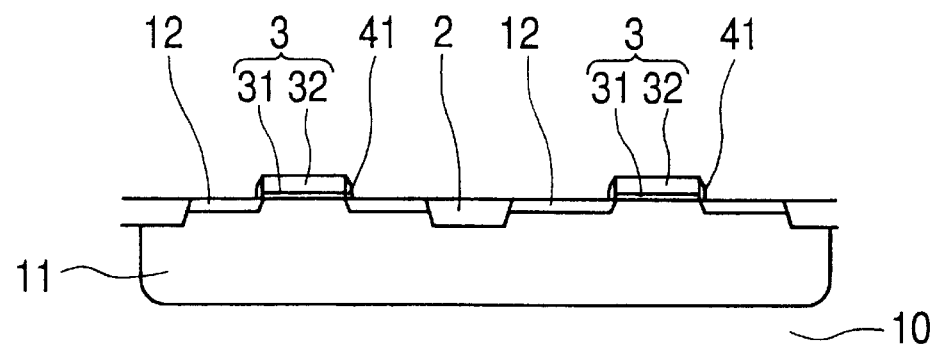
Figure 4D:
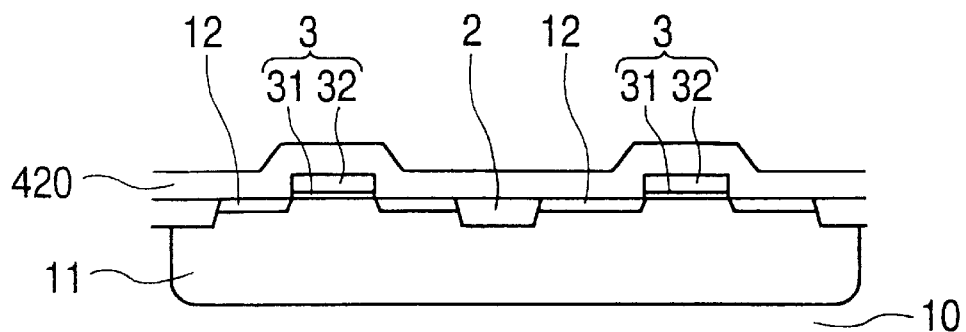

At a step shown in FIG. 4B, a gate oxide film 31 and a gate electrode 32 are formed (gate portion forming step). A first insulating film 41 is formed on the sidewall of the gate portion 3 (first spacer forming step).

Next, an low impurity concentration region is formed by the following steps. At a step shown in FIG. 4C, phosphorus (P) ions are implanted to the surface of the silicon wafer 10 with a condition of an implanting energy of approximately 70 kev, and a dose amount of approximately $1.0 \times 10^{14}$ cm$^{-2}$. An n-type low impurity concentration region 12 is formed at the both sides of the gate portion 3 of the silicon wafer 10 due to a mask operation of the gate portion 3.

A second spacer is formed by the following steps. At a step shown in FIG. 4D, after removing the photoresist, a TEOS 420 is deposited by the CVD.

Figure 4E:
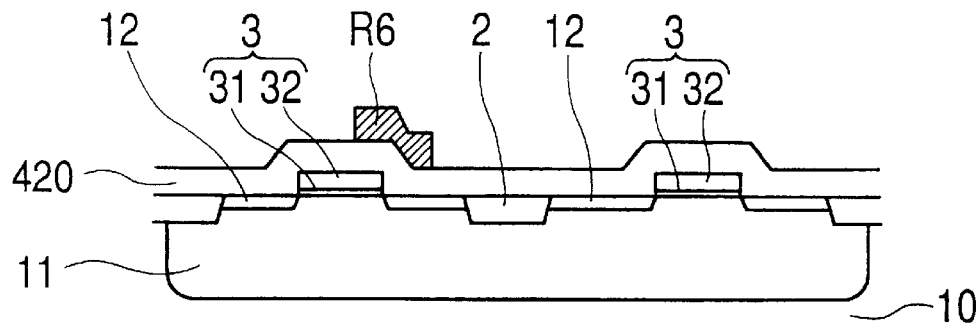

At a step shown in FIG. 4E, a photoresist pattern R6 is formed between the gate portion 3 and the drain 14 (see FIG. 1) of the transistor region 1 by a photolithography so that a left end of the photoresist pattern R6 is slightly superposed with the gate portion 3.

Figure 4F:
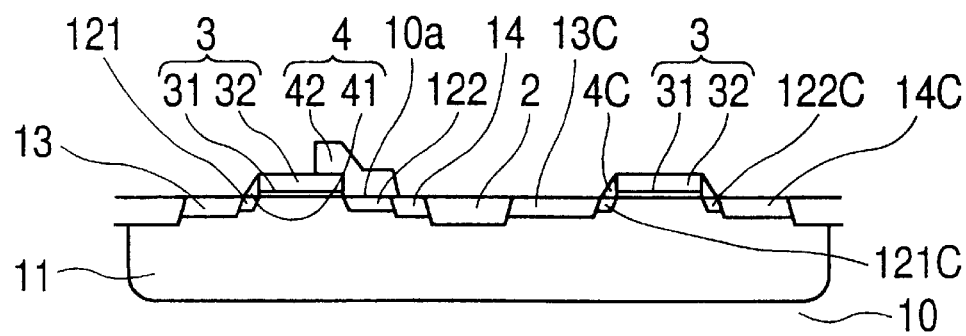

At a step shown in FIG. 4F, one part of the oxide film 410 and one port of the TEOS 420, both of which position at a region where the photoresist pattern R6 is not formed, are removed by an etching using chlorine-based gas such as CF$_4$ so that the oxide film 410 and the TEOS 420 are partially remained only on a sidewall of the gate portion 3 as an insulating film with a self-alignment. In this way, a second insulating film 42 constituting the spacer 4 is formed. Next, the photoresist is removed.

Next, Arsenic (As) ions are implanted to the P-well 11 with a condition of, for example, 40 keV, $5.0 \times 10^{15}$ cm$^{-2}$ to form sources 13, 13C and drains 14, 14C. In the transistor region 1, a source 13 is formed at a left side of the gate portion 3 because the gate portion 3 and the spacer 4 perform as a mask, and a drain 14 is formed at a right side of the insulating film 42 constituting the spacer 4. In the transistor region 1C, a source 13C and a drain 14C are formed at a left and a right sides of the gate portion 3, respectively, because the gate portion 3 performs as a mask. These sources 13, 13C and drains 14, 14C are formed with a substantial self-alignment. Next, the sources 13, 13C and the drains 14, 4C are activated by annealing of 850° C., minutes. An oxide film formed on the surface of the silicon substrate 10 in the activating step is removed.

Figure 4G:
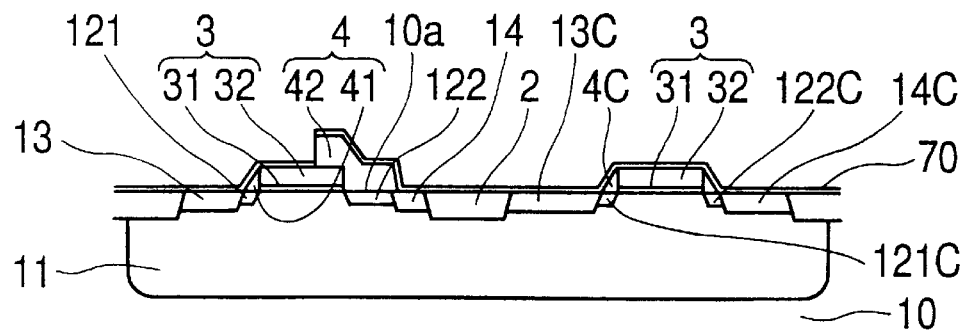

At a step shown in FIG. 4G, metal is formed by the following steps. A Ti/TiN film is deposited on the whole surface of the silicon wafer 10 (Metal deposition step). Then, parts of the transistor region 1 other than the offset region 10a is changed to suicides to form a silicide Ti on the surface of the gate portion 3, the sources 13, 13C and the drains 14, 14C by annealing of a range of 600 to 650° C., 30 seconds, for example (Silicide step).

Figure 4H:
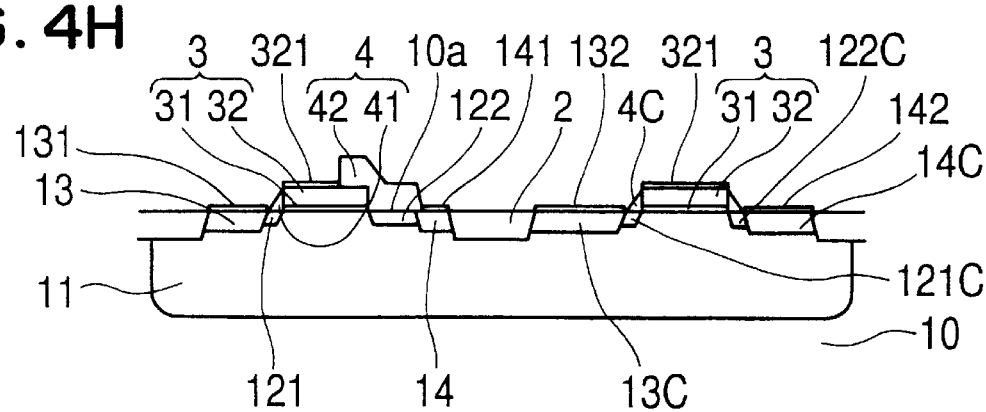

At a step shown in FIG. 4H, the metal is etched by the following steps. The Ti/TiN film 70 on the spacer 4 of the transistor region 1 is removed by a whole surface etching (Metal etching step).

Furthermore, an anneal of a range of 800 to 850° C., 30 seconds is performed to completely alloy the Ti remained on the gate portion 3, the sources 13, 13C and the drains 14, 14C.

Figure 4I:
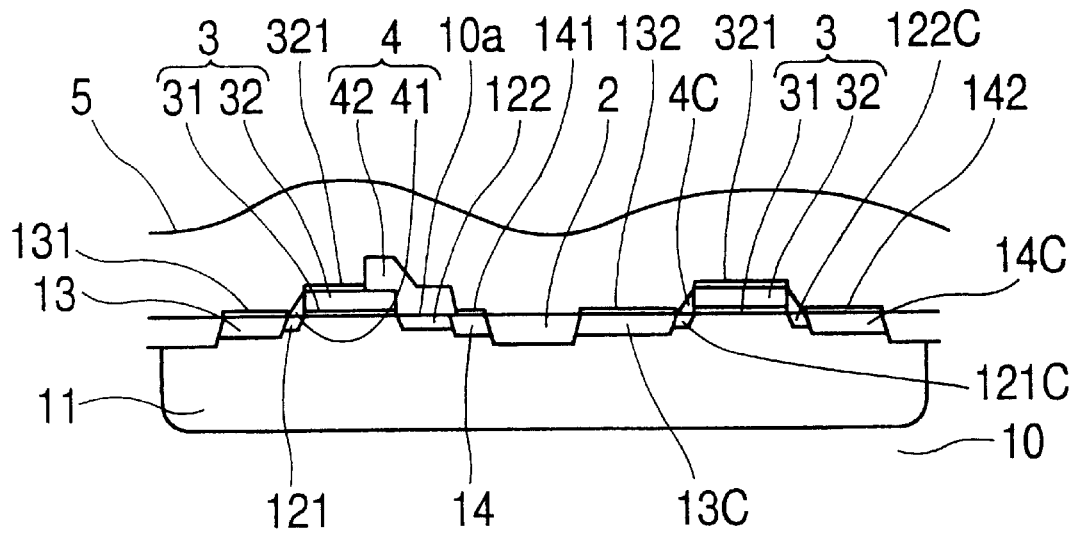

At a step shown in FIG. 4I, after forming a basic structure of the transistor, an interlayer film 5 is formed to cover the silicon wafer 10 having the isolation oxide film 2 and the gate portion 3.

Figure 4J:
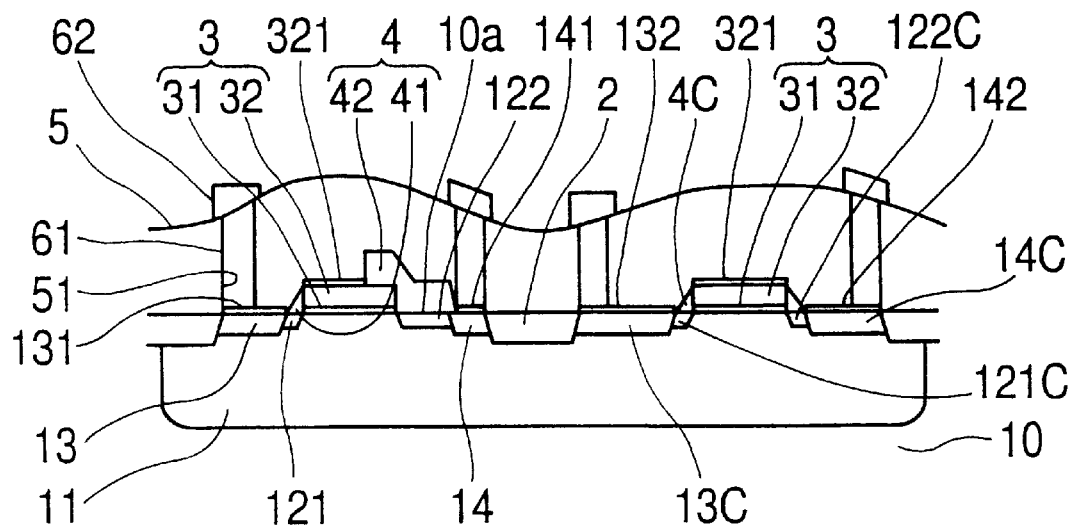

At a step shown in FIG. 4J, contact holes 51 are formed in the interlayer film 5 at the region where the gate portion 3, the sources 13, 13C and the drain 14, 14C are to be formed. After that, W-plug wires 61 are formed, and then Al wire pattern 62 is formed. In these ways, the semiconductor device of this embodiment is completed.

According to the method of manufacture of this embodiment, it can achieve a release of an electric field concentration and a lowering a transistor resistance at the same time, when the present invention is adopted to the semiconductor device having the hybrid structure of the offset-gate structure and the other structure.

Fourth Embodiment

FIGS. 5A through 5M are sectional views of a silicon wafer of each step in a wafer process of the semiconductor device. Here, the steps are explained on the assumption that the semiconductor device of the present invention is adapted to a semiconductor device having a CDDD (Complimentary Double Doped Drain) structure. In these figures, a left side of the silicon wafer 10 is an n-type MOS transistor region (N-channel transistor region) 1D having a double-drain structure as a first kind transistor region, and a right side of the silicon wafer 10 is a p-type MOS transistor region (P-channel transistor region) 1E having a punch-through-stopper layer as a second kind transistor region. In the drawings, same portions or corresponding portions are put the same numerals each other because they are formed by substantially the same steps and perform substantially the same effect. The difference between the First Embodiment will be mainly explained.

Figure 5A:
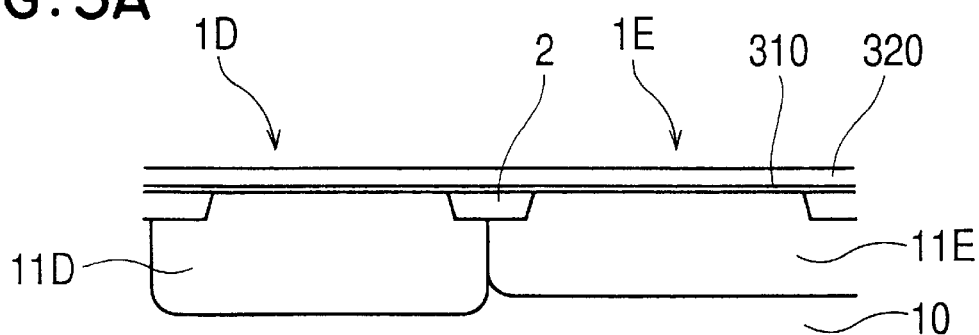
FIGS. 5A through 5M are schematic sectional views illustrating each step of a method of manufacturing the semiconductor device of a Fourth Embodiment.

At a step shown in FIG. 5A, an element isolation oxide film 2 is formed on the surface of the silicon wafer 10, and a protection oxide film having a thickness of approximately 350 Å is formed on the surface of the silicon wafer 10. A p-well 11D and an n-type well (N-well) 11E are formed in the silicon wafer 10 by implanting impurities and annealing the silicon wafer 10. The oxide film formed in the annealing step is removed by a wet etching using hydrofluoric acid (HF). Then, an oxide film 310 and polysilicon film 320 are formed.

Figure 5B:
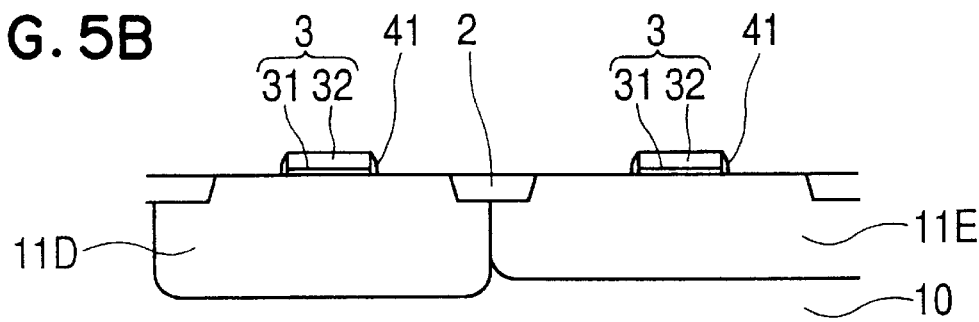

At a step shown in FIG. 5B, a gate oxide film 31 and a gate electrode 32 are formed (gate portion forming step). A first insulating film 41 is formed on the sidewall of the gate portion 3 (first spacer forming step).

Figure 5C:
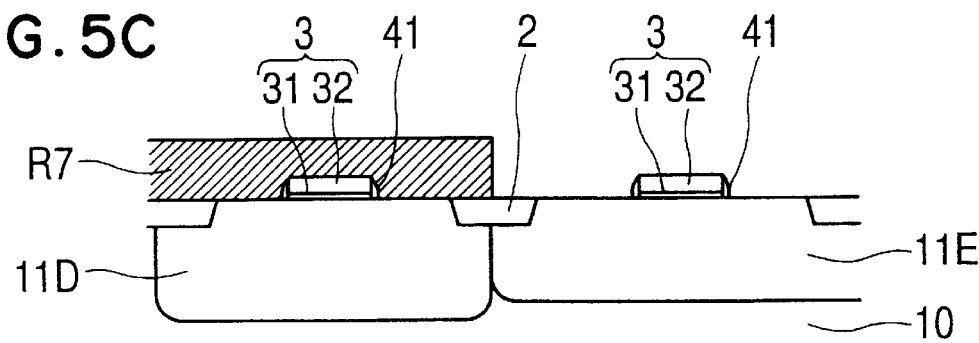

At a step shown in FIG. 5C, a photoresist pattern R7 is formed on the n-channel transistor region 1D by a photolithography. Boron (B) ions are selectively implanted to the surface of the p-channel transistor region 1E with 50 keV and $5.0\times10^{13}$ cm$^{-2}$, and with 30 keV and $4.0\times10^{13}$ cm$^{-2}$.

Figure 5D:
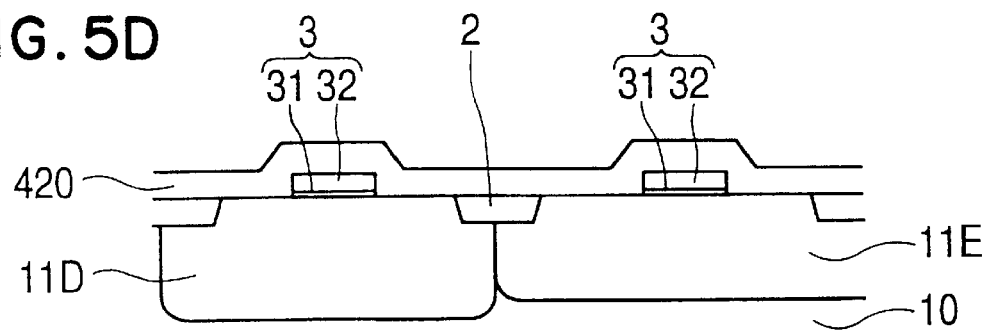

At a step shown in FIG. 5D, a second spacer is formed by the following steps. After removing the photoresist R7, a TEOS 420 having a thickness of 1500 Å is deposited by the CVD.

Figure 5E:
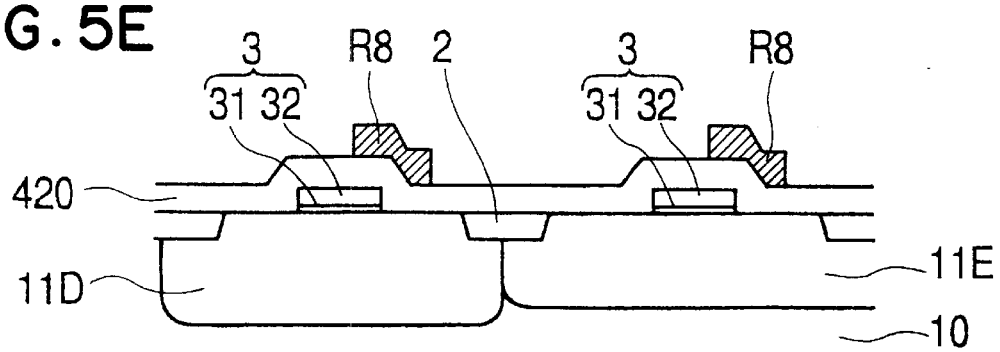

At a step shown in FIG. 5E, a photoresist pattern R3 is formed between the gate portion 3 and the drain 14 (see FIG. 1) by a photolithography so that a left end of the photoresist pattern R8 is slightly superposed with the gate portion 3.

Figure 5F:
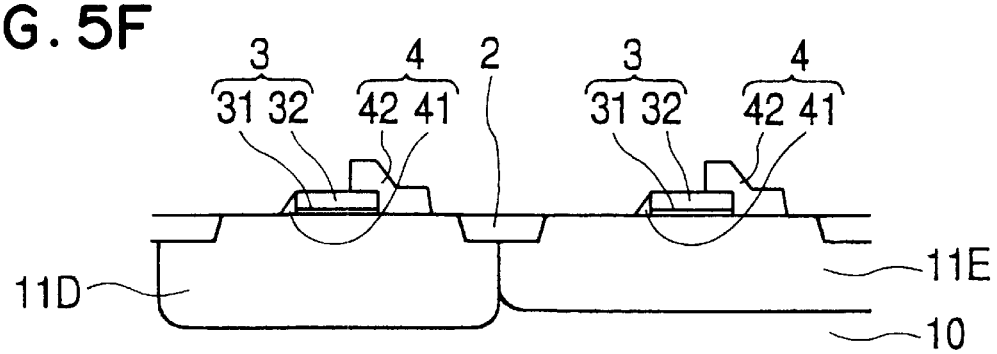

At a step shown in FIG. 5F, one part of the oxide film 410 and one port of the TEOS 420, each of which positions at a region where the photoresist pattern R8 is not formed, are removed by an etching using chlorine-based gas such as $CF_4$ so that the oxide film 410 and the TEOS 420 are partially remained only on a sidewall of the gate portion 3 as an insulating film with a self-alignment. In this way, a second insulating film 42 constituting the spacer 4 is formed at the transistor regions 1D, 1E. Next, the photoresist R8 is removed.

Figure 5G:
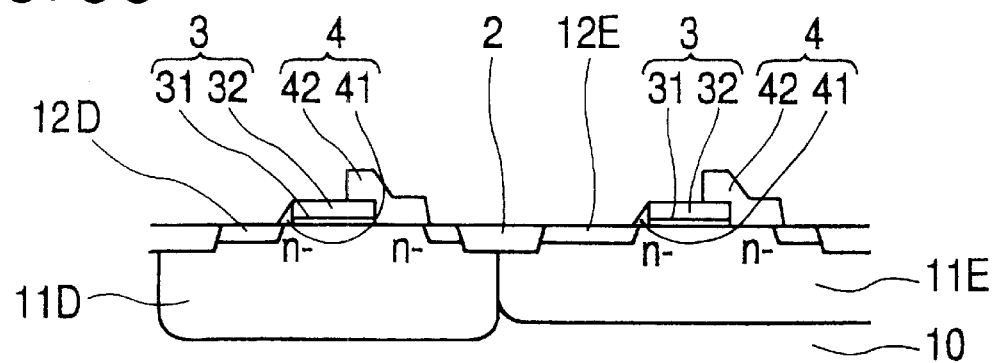
Figure 5H:
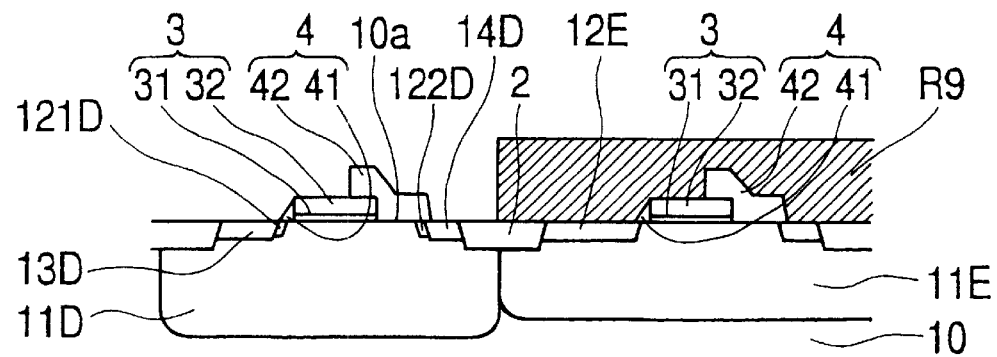

At a step shown in FIG. 5G, phosphorus (P) ions are implanted to the surface of the silicon wafer 10 with a condition of an implanting energy of approximately 70 keV, a dose amount of approximately $1.0\times10^{14}$ cm$^{-2}$, and an implanting angle of 45° In the P-well 11D and N-well 11E of the both transistor regions 1D, 1E, impurity regions 12D, 12E are formed at a left side of the gate portion 3 and a right side of the insulating film 42. Here, since the ion implantation is performed at an angle of 45°, the impurity regions 12D, 12E are slightly superposed with portions where the gate portion 3 and the spacer 4 are to be formed so that part of the impurity regions 12D, 12E slightly enter under the gate portion 3 and the spacer.4.

A first source/drain forming step is executed. At a step shown in FIG. 5H, a photoresist pattern R9 is formed at the transistor region 1E by the photolithography. Arsenic (As) ions are implanted only to the P-well 11D, at which the photoresist pattern R9 is not formed, with a condition of, for example, 40 keV, $5.0\times10^{15}$ cm$^{-2}$ to form a source 13D and a drain 14D in the P-well 11D.

Figure 5I:
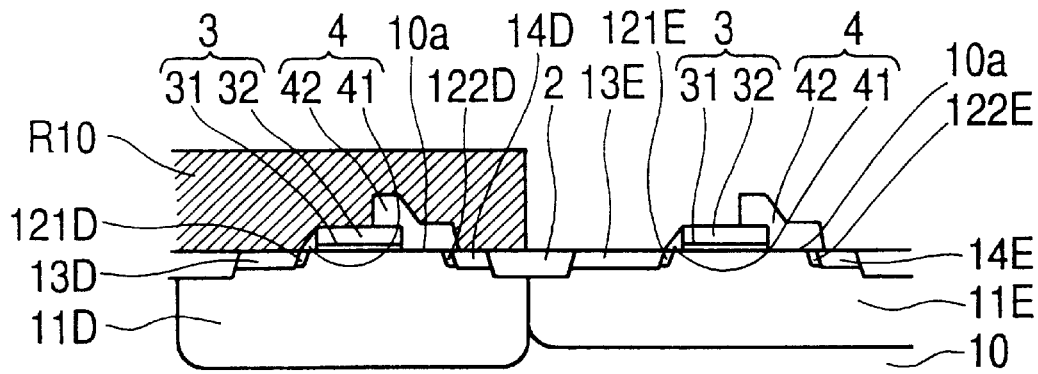

At a step shown in FIG. 5I, after removing the photoresist R9, a photoresist pattern R10 is formed at the transistor region 1D by the photolithography. Boron fluoride ($BF_2$) ions are implanted only to the N-well 11E, at which the photoresist pattern R10 is not formed, with a condition of, for example, 110 keV, $5.0\times10^{13}$ cm$^{-2}$ to form a source 13E and a drain 14E in the N-well 11E.

In each transistor regions 1D, 1E, the source regions 13D, 13E are formed at the left side of the gate portion 3, and the drains 14D, 14E are formed at the right side of the insulating film 42. Here, since the impurity regions 12D, 12E are formed so that part of them enter under the gate portion 3 and the spacer 4 which are to be mask, electric field releasing layers 121D, 122D are formed at the one ends of the sources 13D, 13E and the drains 14D, 14E in the n-channel transistor region 1D, and the punch-through-stopper layers 121E, 122E are formed in the p-channel transistor region 1E. Here, the electric field releasing layers 121D, 122D have the same conductivity type as that of the source 13D and the drain 14D, which constitute the double-drain structure. The punch-through-stopper layers 121E, 122E have the opposite conductivity type of that of the source 13E and the drain 14E.

Next, the sources 13D, 13E and the drains 14D, 14E are activated by annealing of approximately 850° C., 20 minutes. An oxide film formed on the surface of the silicon substrate 10 in the activating step is removed.

Figure 5J:
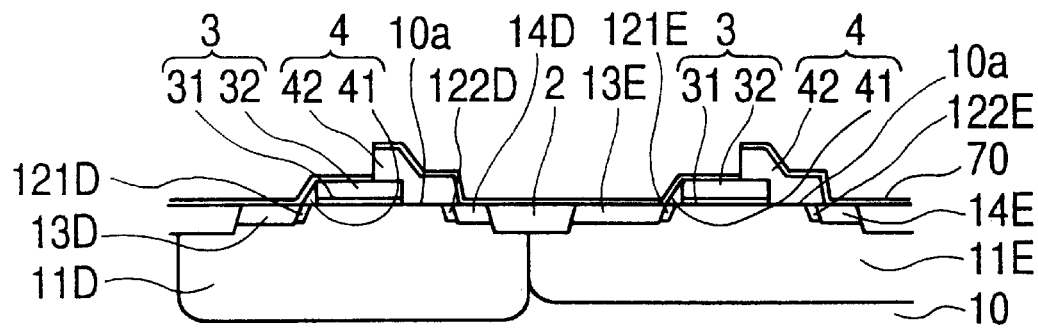

At a step shown in FIG. 5J, metal is formed by the following steps. A Ti/TiN film is deposited on the whole surface of the silicon wafer 10 (Metal deposition step). Then, silicide Ti is formed on the surface of the gate portion 3, the sources 13D, 13E and the drains 14D, 14E by annealing of a range of 600 to 650° C., 30 seconds (Silicide step).

Figure 5K:
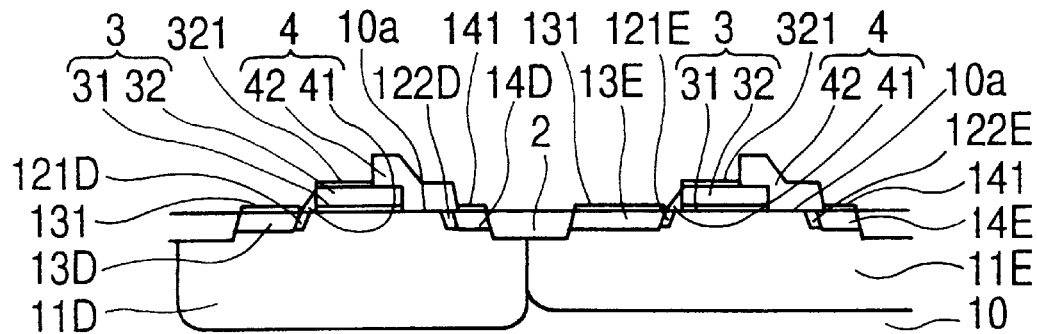

At a step shown in FIG. 5K, the metal is etched by the following steps. The Ti/TiN film 70 on the spacer 4 of the both transistor regions 1D, 1E is removed by a whole surface etching (Metal etching step).

Furthermore, an anneal of a range of 800 to 850° C., 30 seconds is performed to completely alloy the Ti remained on the gate portion 3, the sources 13D, 13E and the drains 14D, 14E.

Figure 5L:
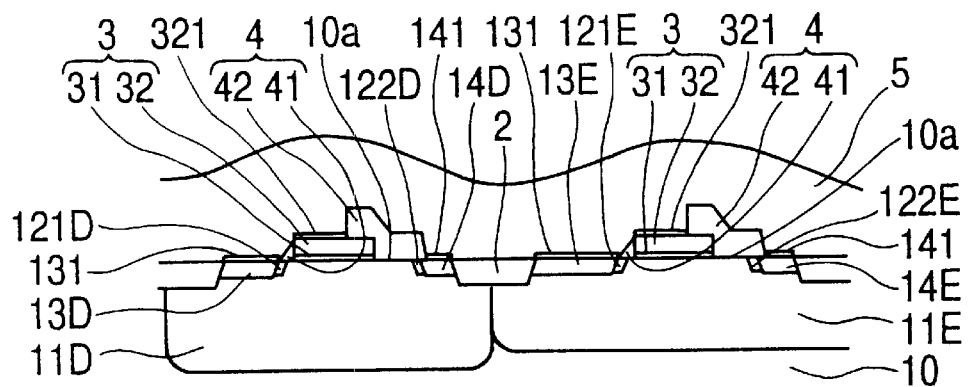

At a step shown in FIG. 5L, after forming a basic structure of the transistor, an interlayer film 5 is formed to cover the silicon wafer 10 having the gate portion 3 and the spacer 4.

Figure 5M:
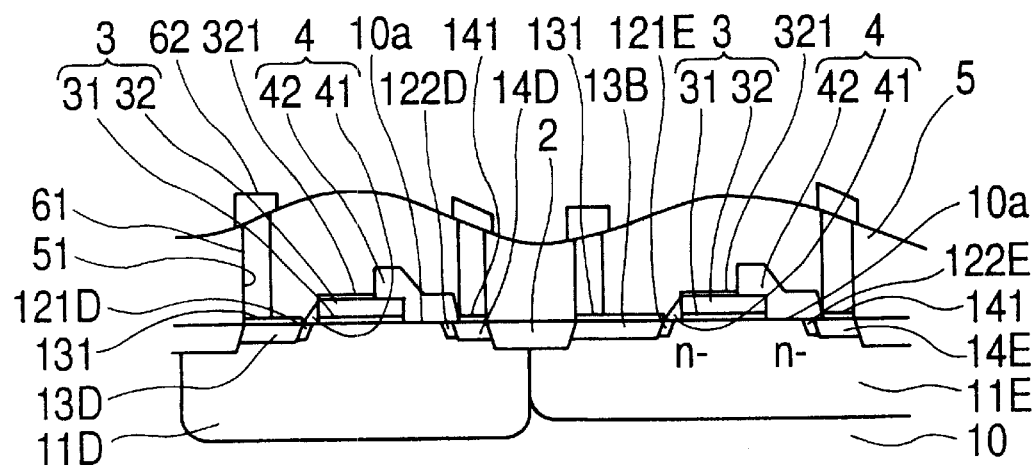

At a step shown in FIG. 5M, contact holes 51 are formed in the interlayer film 5 at the region where the gate portion 3, the sources 13D, 13E and the drains 14D, 14E are to be formed. After that, W-plug wires 61 are formed, and then Al wire pattern 62 is formed. In these ways, the semiconductor device of this embodiment is completed.

According to the method of manufacture of this embodiment, it can achieve a release of an electric field concentration and a lowering a transistor resistance at the same time, when the present invention is adopted to the semiconductor device having the CDDD structure.

Fifth Embodiment

FIGS. 6A through 6L are sectional views of a silicon wafer of each step in a wafer process of the semiconductor device. Here, the steps are explained on the assumption that the semiconductor device of the present invention is adapted to a semiconductor device having a hybrid structure of a Salicide transistor and a normal non-Salicide transistor. In these figures, a left side of the silicon wafer 10 is a transistor region 1 having the Salicide transistor, and a right side of the silicon wafer 10 is a transistor region 1F having the non-Salicide transistor. In the drawings, same portions or corresponding portions are put the same numerals each other because they are formed by substantially the same steps and perform substantially the same effect. The difference between the First Embodiment will be mainly explained. Here, the steps are explained on the assumption that the transistor is an n-type MOS.

Figure 6A:
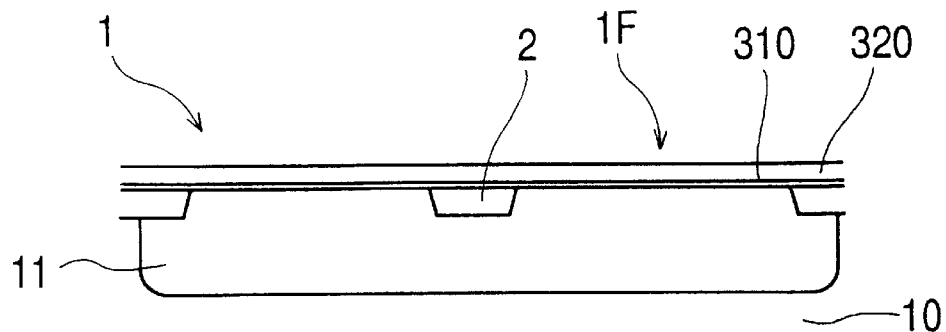
FIGS. 6A through 6L are schematic sectional views illustrating each step of a method of manufacturing the semiconductor device of a Fifth Embodiment.

At a step shown in FIG. 6A, an element isolation oxide film 2 is formed on the surface of the silicon wafer 10, and a protection oxide film having a thickness of approximately 350 Å is formed on the surface of the silicon wafer 10. A p-well 11 is formed in the silicon wafer 10 by implanting impurities and annealing the silicon wafer 10. The oxide film formed in the annealing step is removed by a wet etching using hydrofluoric acid (HF). Then, an oxide film 310 and polysilicon film 320 are formed.

Figure 6B:
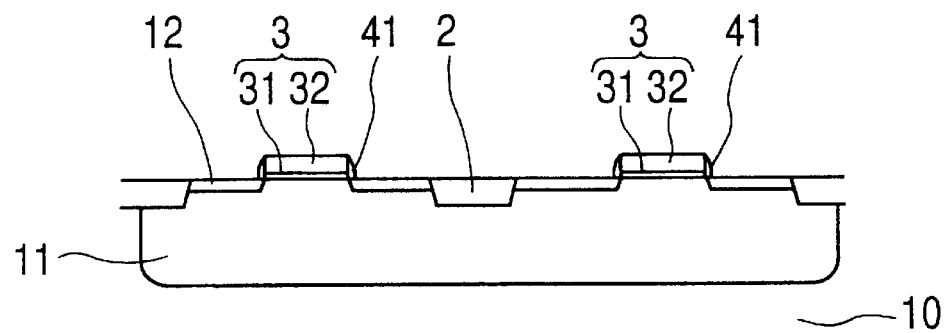
Figure 6C:
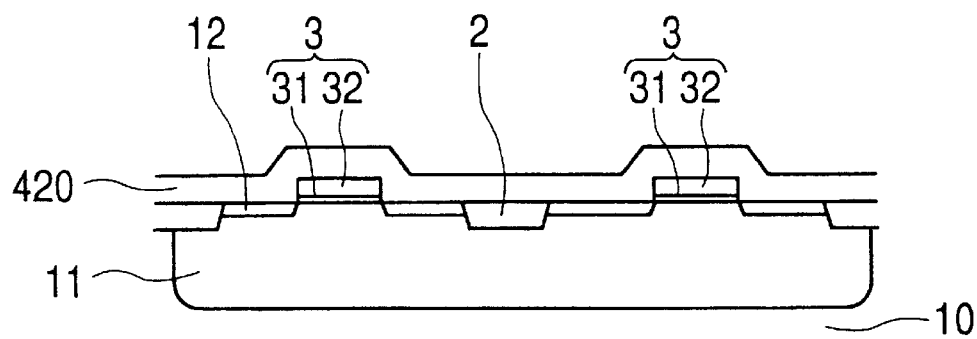

At a step shown in FIG. 6B, a gate oxide film 31 and a gate electrode 32 are formed (gate portion forming step). A first insulating film 41 is formed on the sidewall of the gate portion 3 (first spacer forming step).

Phosphorus (P) ions are implanted to the surface of the silicon wafer 10 with a condition of an implanting energy of approximately 70 keV, and a dose amount of approximately $1.0 \times 10^{14}$ cm$^{-2}$. An n-type low impurity concentration region 12 is formed at the both sides of the gate portion 3 in the P-well 11 due to a mask operation of the gate portion 3.

A second spacer is formed by the following steps. At a step shown in FIG. 6C, after removing the photoresist, a TEOS 420 is deposited by the CVD.

Figure 6D:
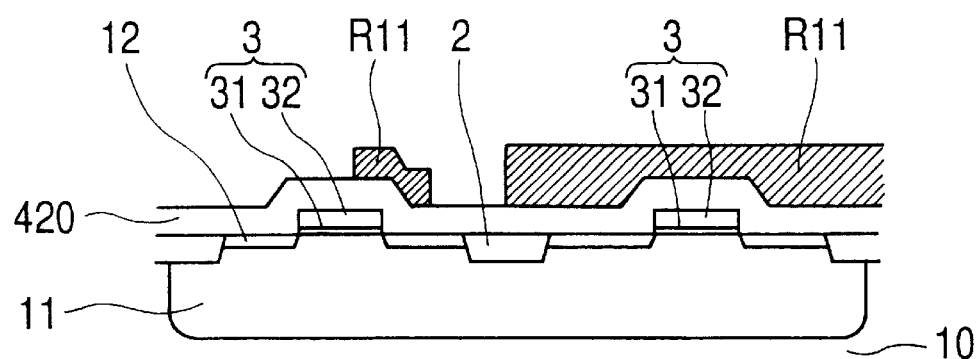

At a step shown in FIG. 6D, a photoresist pattern R11 is formed. At the transistor region 1, the photoresist pattern R11 is formed at the region between the gate portion 3 and the drain 14 (see FIG. 1)so that a left end of the photoresist pattern R11 is slightly superposed with the gate portion 3. At the transistor region 1F, the photoresist pattern R11 is formed on the hole surface of the transistor region 1F.

Figure 6E:
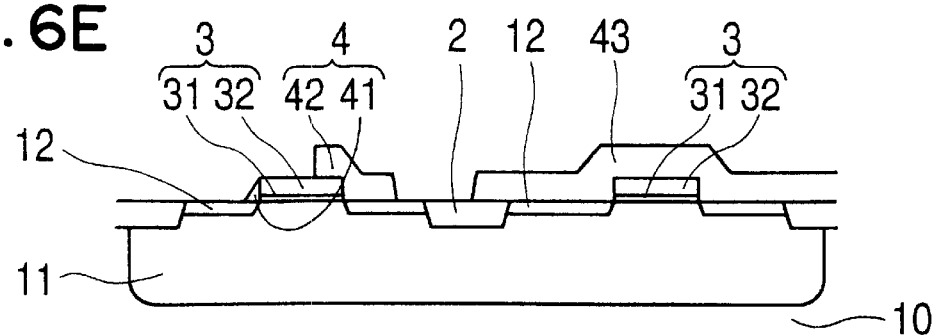

At a step shown in. FIG. 6E, one part of the oxide film 410 and one port of the TEOS 420, both of which position at a region where the photoresist pattern R11 is not formed, are removed by an etching using chlorine-based gas such as $CF_4$ so that the oxide film 410 and the TEOS 420 are partially remained only on a sidewall of the gate portion 3 as an insulating film with a self-alignment. Next, the photoresist is removed. In this way, a second insulating film 42 constituting the spacer 4 is formed at the offset region 10a where the gate portion 3 is not formed in the transistor region 1. Furthermore, the whole surface of the transistor region 1F is covered with the insulating film 43.

Figure 6F:
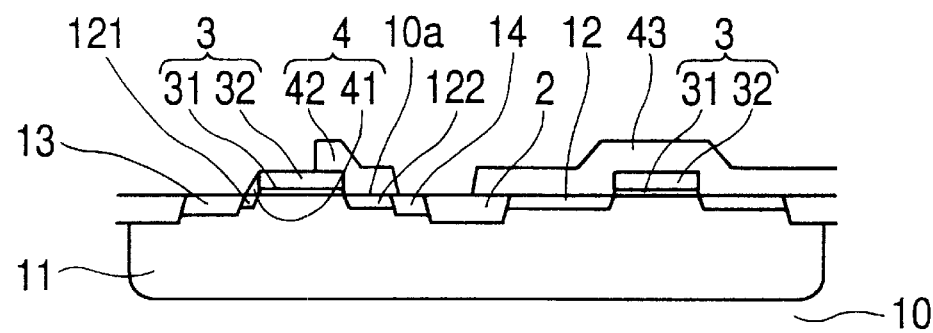

At a step shown in FIG. 6F, a source and drain of the transistor region 1 is formed by the following steps. That is, arsenic (As) ions are implanted to the P-well 11 with a condition of, for example, 40 keV, $5.0 \times 10^{15}$ cm$^{-2}$ to form a source 13 and a drain 14. The source 13 is formed at a left side of the gate portion 3 because the gate portion 3 and the spacer 4 perform as a mask, and the drain 14 is formed at a right side of the insulating film 42. Next, the source 13 and the drain 14 are activated by annealing of 850° C., 20 minutes. An oxide film formed on the surface of the silicon substrate 10 in the activating step is removed.

Figure 6G:
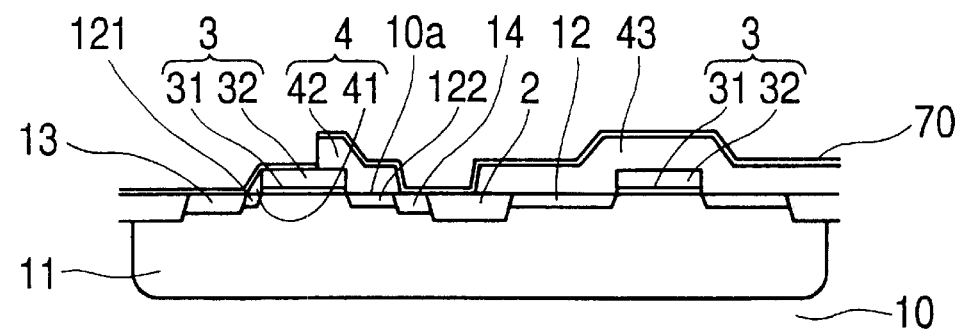

At a step shown in FIG. 6G, metal is formed by the following steps. ATi/TiN film is deposited on the whole surface of the silicon wafer 10 (Metal deposition step). Then, parts of the transistor region 1 other than the offset region 10a and the whole area of the transistor region 1F is changed to silicides to form a silicide Ti on the surface of the gate portion 3, the sources 13, 13C and the drains 14, 14C by annealing of a range of 600 to 650° C., 30 seconds, for example (Silicide step).

Figure 6H:
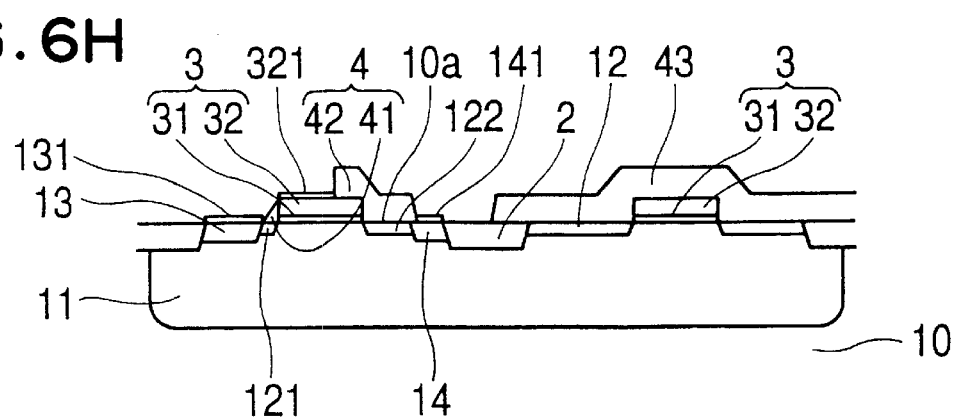

At a step shown in FIG. 6H, the metal is etched by the following steps. The Ti/TiN film 70 on the spacer 4 of the transistor region 1 and on the insulating film 43 covering the whole area of the transistor region 1F is removed by a whole surface etching (Metal etching step).

Furthermore, an anneal of a range of 800 to 850° C., 30 seconds is performed to completely alloy the Ti remained on the gate portion 3, the source 13 and the drain 14 of the transistor region 1.

Figure 6I:
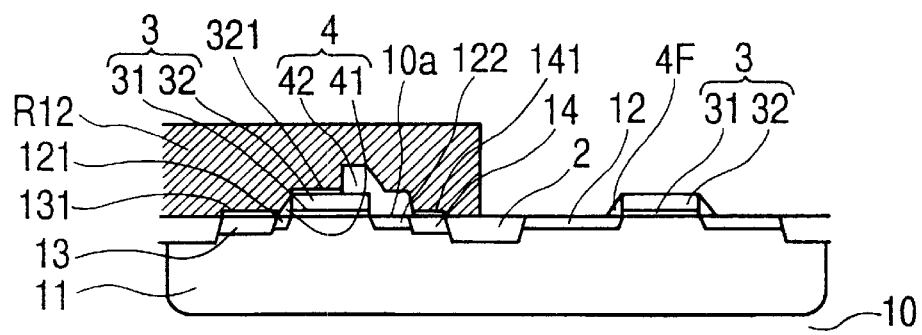

At a step shown in FIG. 6I, a photoresist pattern R12 is formed on only the transistor region 1. The insulating film 43 of the transistor region 1F, where the photoresist pattern R12 is not formed, is removed by an etching using chlorine-based gas such as $CF_4$.

Figure 6J:
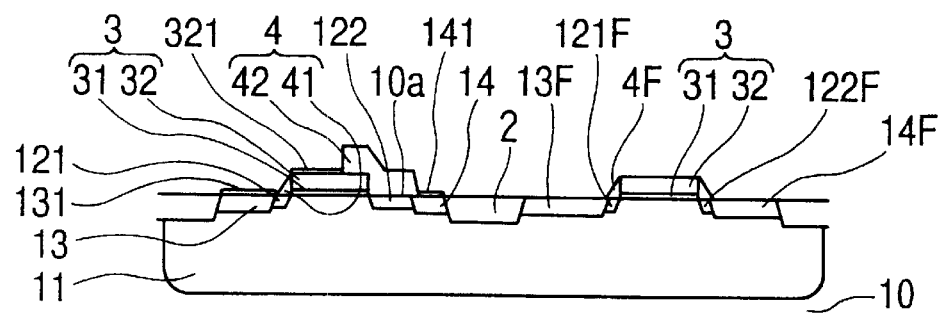

At a step shown in FIG. 6J, a source and a drain of the transistor region 1F are formed by selectively implanting arsenic (As) ions with a condition of, for example, 40 keV, $5.0 \times 10^{15}$ cm$^{-2}$. In this step, the source 13F and the drain 14F are formed at the both sides of the gate portion 3 with a self-alignment, because the gate portion 3 performs as a mask. Next, the source 13F and the drain 14F are activated by annealing of approximately 850° C., 20 minutes.

Figure 6K:
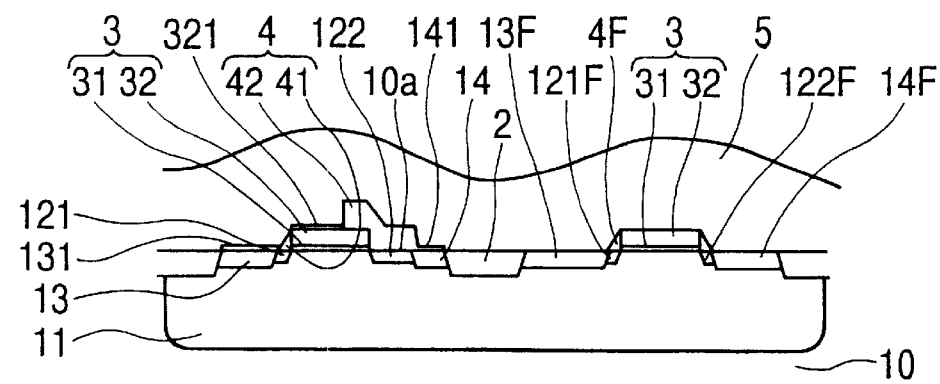

At a step shown in FIG. 6K, after forming a basic structure of the transistor, an interlayer film 5 is formed to cover the silicon wafer 10 having the gate portion 3 and the spacer 4.

Figure 6L:
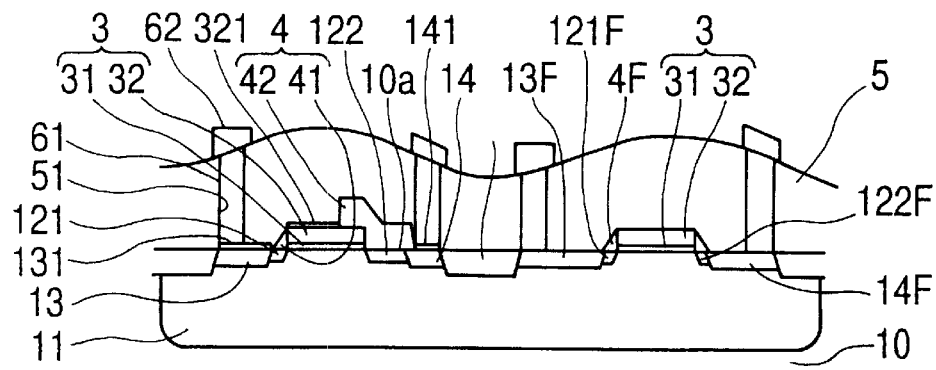

At a step shown in FIG. 6L, contact holes 51 are formed in the interlayer film 5 at the region where the gate portion 3, the sources 13, 13F and the drain 14, 14F are to be formed. After that, W-plug wires 61 are formed, and then Al wire pattern 62 is formed. In these ways, the semiconductor device of this embodiment is completed.

According to the method of manufacture of this embodiment, it can achieve a release of an electric field concentration and a lowering a transistor resistance at the same time, when the present invention is adopted to the semiconductor device having the hybrid structure of a Salicide transistor and a normal non-Salicide transistor.

What is claimed is:

1. A method of manufacturing a semiconductor device comprising;

forming an oxide film and a polysilicon layer on a silicon substrate, and patterning the polysilicon layer to form a gate portion;

forming a first insulating film on a sidewall of the gate portion to form a first spacer;

depositing a second insulating film over the silicon substrate;

disposing a mask layer on the second insulating film to mask a portion of the gate portion and an offset region defined between the gate portion and a predetermined portion where a drain is to be formed;

patterning the second insulating film using the mask layer as a mask to form a second spacer, said second spacer being wider than the first spacer;

implanting impurities to the silicon substrate by using the gate portion and the first and second spacers as a mask to form a source and a drain;

depositing metal on an entire surface of the silicon substrate with the second spacer disposed on the portion of the gate portion and the offset region, said portion of the gate portion and the offset region being free from the deposited metal;

changing the disposed metal to silicide by annealing the silicon substrate; and removing the metal that is not changed to silicide by etching the entire surface of the silicon substrate.

2. A method of manufacturing a semiconductor device according to claim 1, further comprising between forming the first spacer and the second spacer:

forming an electrical field releasing layer having a low impurity concentration with respect to the source and the drain by implanting impurities to the silicon substrate by using the gate portion as a mask.

3. A method of manufacturing a semiconductor device according to claim 1, further comprising before forming the gate portion:

forming a first transistor region having a first conductivity type and a second transistor region having a second conductivity type, wherein the implanting to form the source and drain implants the second conductivity type impurities to the first transistor region to form an n-channel type transistor therein, and implants the first conductivity type impurities to the second transistor region to form a p-channel type transistor therein.

4. A method of manufacturing a semiconductor device according to claim 3, wherein:

at least one of the first transistor region and the second transistor region has the offset region, and the second insulating film is formed on the offset region of said one of the first transistor region and the second transistor region that has the offset region.

5. A method of manufacturing a semiconductor device according to claim 1, further comprising before forming the gate portion:

forming a first transistor region having a first conductivity type and a second transistor region having a second conductivity type, and between forming the second spacer and said depositing metal, further comprising:

implanting the first conductivity type impurities to the first transistor region and the second transistor region to form impurity regions that partially superpose with predetermined regions where the gate portion and the first and second spacers are to be formed;

selectively implanting the first conductivity type impurities to the first transistor region to form a source and a drain, each of which having a high impurity concentration with respect to that of the impurity region, to form a transistor having a double drain in the first transistor region; and selectively implanting the second conductivity type impurities to the second transistor region to form a source and a drain, to form a transistor having a punch-through-stopper layer in the second transistor region.

6. A method of manufacturing a semiconductor device according to claim 1, wherein:

forming the second spacer further includes forming the second insulating film on a predetermined region, on which the silicide is not formed, as well as the offset region; and the deposited metal is changed to silicide where the second insulating film is removed from the silicon substrate at the patterning step.

7. A method of manufacturing a semiconductor device according to claim 1, wherein said second insulating film overlaps the gate portion, whereby a part of the gate portion disposed under the second insulating film is not changed to the silicide.

8. A method of manufacturing a semiconductor device according to claim 1, wherein said first insulating film is patterned and remains by self-alignment, and said second insulating film remains on the offset region and overlaps the gate portion as the second spacer when patterned.

9. A method of manufacturing a semiconductor device according to claim 8, wherein said offset region is formed before the second insulating film is formed.

10. A method of manufacturing a semiconductor device comprising;

forming a gate electrode of polysilicon over a silicon substrate;

depositing an insulating film over the silicon substrate;

disposing on the insulating film a mask layer which has a pattern covering a portion of the gate electrode and an offset region defined between the gate portion and a predetermined portion where a drain is to be formed;

patterning the insulating film using the mask layer as an etching mask to form a spacer, said spacer having a pattern transferred from the mask layer and extending over the portion of the gate electrode and the offset region;

implanting impurities to the silicon substrate by using the gate portion and the spacer as an implanting mask to form a source and a drain, a distance from the gate electrode and the drain being defined by the spacer;

depositing metal on an entire surface of the silicon substrate with the spacer interposed therebetween, the portion of the gate electrode and the offset region of the silicon substrate being protected from the deposited metal by the spacer, such that the portion of the gate electrode and the offset region are free from the deposited metal;

changing the disposed metal to silicide by annealing the silicon substrate; and removing the metal that is not changed to silicide by etching the entire surface of the silicon substrate.

* * * * *